United States Patent
Jeong et al.

(10) Patent No.: US 10,303,315 B2
(45) Date of Patent: May 28, 2019

(54) FLEXIBLE DISPLAY DEVICE

(71) Applicant: Samsung Display Co., Ltd., Yongin-si (KR)

(72) Inventors: Beunghwa Jeong, Cheonan-si (KR); Yang-ho Jung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 220 days.

(21) Appl. No.: 15/489,830

(22) Filed: Apr. 18, 2017

(65) Prior Publication Data

US 2017/0308196 A1    Oct. 26, 2017

(30) Foreign Application Priority Data

Apr. 22, 2016  (KR) .......... 10-2016-0049595
Jan. 25, 2017  (KR) .......... 10-2017-0012241

(51) Int. Cl.
| | | |
|---|---|---|
| G06F 3/044 | (2006.01) | |
| H01L 27/32 | (2006.01) | |
| H01L 51/00 | (2006.01) | |
| H01L 51/52 | (2006.01) | |

(52) U.S. Cl.
CPC .......... *G06F 3/044* (2013.01); *H01L 27/323* (2013.01); *H01L 27/3244* (2013.01); *H01L 51/0097* (2013.01); *H01L 51/5253* (2013.01); *G06F 2203/04102* (2013.01); *G06F 2203/04103* (2013.01); *H01L 51/5275* (2013.01); *H01L 2251/5338* (2013.01); *Y02E 10/549* (2013.01)

(58) Field of Classification Search
CPC .............. H01L 51/0097; H01L 27/323; H01L 2251/5338; H01L 27/3244; H01L 51/5253; H01L 51/527; G06F 3/044; G06F 2203/04102; G06F 2203/04103; Y02E 10/549

See application file for complete search history.

(56) References Cited

U.S. PATENT DOCUMENTS

| | | |
|---|---|---|
| 2009/0166637 A1 | 7/2009 | Park et al. |
| 2015/0062467 A1 | 3/2015 | Kang |
| 2015/0102298 A1 | 4/2015 | Namkung et al. |
| 2015/0243705 A1 | 8/2015 | Kim |
| 2016/0035759 A1* | 2/2016 | Kwon .......... H01L 27/1244 257/40 |

(Continued)

FOREIGN PATENT DOCUMENTS

| | | |
|---|---|---|
| KR | 10-1269337 | 5/2013 |
| KR | 10-2013-0072402 | 7/2013 |

(Continued)

*Primary Examiner* — Muhammad N Edun
(74) *Attorney, Agent, or Firm* — H.C. Park & Associates, PLC

(57) ABSTRACT

A flexible display device including a display panel providing a base surface and a touch sensing part disposed on the base surface. The display panel further includes a buffer layer and is divided into a plurality of emission areas and non-emission areas disposed adjacent thereto. The buffer layer includes recessed portions, each of which has a groove defined in a corresponding emission area of the emission areas and flat portions connected to the recessed portions. The touch sensing part disposed on the buffer layer includes conductive patterns and an insulation layer covering the conductive patterns.

20 Claims, 31 Drawing Sheets

(56) References Cited

U.S. PATENT DOCUMENTS

2016/0172623 A1\* 6/2016 Lee ................... H01L 51/5253
257/40

FOREIGN PATENT DOCUMENTS

| KR | 10-1362980 | 2/2014 |
| KR | 10-1486974 | 1/2015 |
| KR | 10-2015-027956 | 3/2015 |
| KR | 10-2015-0043647 | 4/2015 |
| KR | 10-2015-0101500 | 9/2015 |

\* cited by examiner

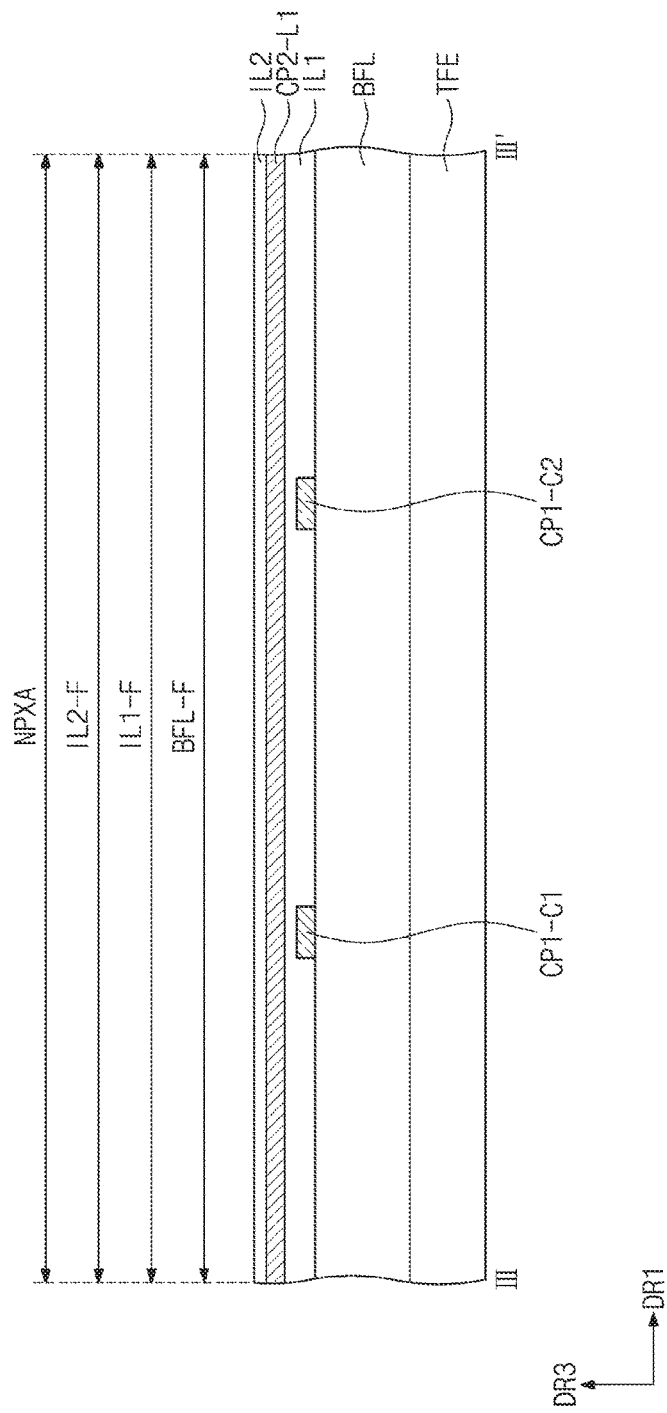

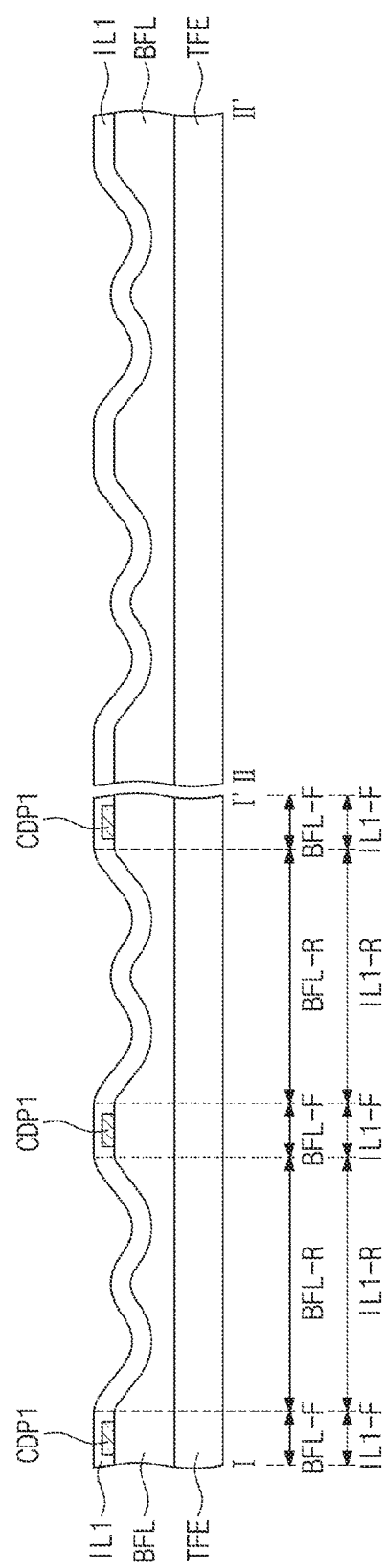

FLEXIBLE DISPLAY DEVICE

CROSS-REFERENCE TO RELATED APPLICATIONS

This application claims priority from and the benefit of Korean Patent Application Nos. 10-2016-0049595, filed on Apr. 22, 2016, and 10-2017-0012241, filed on Jan. 25, 2017, which are hereby incorporated by reference for all purposes as if fully set forth herein.

BACKGROUND

Field

Exemplary embodiments relate to a flexible display device. More particularly, exemplary embodiments relate to a flexible display device integrated with a touch sensing part.

Discussion of the Background

Various kinds of electronic devices, such as smartphones, digital cameras, notebook computers, navigation systems, and smart televisions are being developed. Each of the kinds of electronic devices may include a display device to provide information.

As the various kinds of electronic devices are developed to have various shapes, display devices are also being developed to have shapes that correspond to those of the electronic devices. Electronic devices may generally include a flat-type display device. However, there is a need in recent electronic devices for a flexible-type display device, such as a curved, bent, and rolling-type display device.

In addition, consumers may desire for a kind of display devices that may be bent or curved in various directions. As such, interests in the display devices that may be bent are increasing.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a flexible display device having improved flexibility.

Additional aspects will be set forth in the detailed description which follows, and, in part, will be apparent from the disclosure, or may be learned by practice of the inventive concept.

An exemplary embodiment discloses a flexible display device including: a display panel including a base substrate, a circuit layer disposed on the base substrate, an element layer disposed on the circuit layer, an encapsulation layer configured to encapsulate the element layer, and a buffer layer disposed on the encapsulation layer and divided into emission areas and a non-emission area disposed adjacent thereto; and a touch sensing part including conductive patterns disposed on the buffer layer and an insulation layer configured to cover the conductive patterns. The buffer layer includes recessed portions, each of which has a groove overlapping a corresponding emission area of the emission areas and flat portions connected to the recessed portions.

The flat portions may overlap the non-emission area, and the conductive patterns may be disposed on the flat portions.

The conductive patterns may include first conductive patterns disposed on the buffer layer and second conductive patterns disposed on the first conductive patterns to overlap a portion of the first conductive patterns, and the insulation layer may include a first insulation layer configured to cover the first conductive patterns and a second insulation layer disposed on the first insulation layer to cover second conductive patterns.

The first conductive patterns may extend in a first directional axis and be arranged in a second directional axis perpendicular to the first directional axis on the buffer layer, and the second conductive patterns may extend in the second directional axis and be arranged in the first directional axis on the first insulation layer.

The respective conductive patterns of the first conductive patterns and the second conductive patterns have a mesh shape in which a plurality of touch openings are defined.

The insulation layer may entirely overlap the buffer layer, and the insulation layer may include insulative flat portions overlapping the flat portions and insulative recessed portions overlapping the recessed portions.

The insulative flat portions may cover the conductive patterns, and each of the insulative flat portions may have a flat top surface.

Each of the insulative recessed portions may have an insulation groove overlapping a corresponding emission area of the emission areas.

The grooves and the insulation grooves may have a one-to-one correspondence with each other.

Each of the recessed portions may include a top surface defined by the grooves, and the top surface may include a first sub-recessed portion, a second sub-recessed portion, and a recessed connecting portion configured to connect the first sub-recessed portion to the second sub-recessed portion.

The recessed connecting portion may have a maximum height equal to or less than a height of the flat portion.

The recessed portions may be arranged in a first directional axis and extend in a second directional axis perpendicular to the first directional axis, and the recessed portions may be bent several times on a plane defined by the first directional axis and the second directional axis.

The flexible display device may be bent along a bending axis parallel to the second directional axis.

The recessed portions may provide a plurality of patterns respectively protruding in both directions opposite to each other, and a reference axis defined by an average of a tangential line tangent to at least two positions protruding in one direction of both directions and a tangential line tangent to at least two positions protruding in the other direction, which is opposite to the one direction, of both directions in the plurality of patterns may be inclined at an angle of about 5° to about 85° from the bending axis.

The flat portions may be arranged in the first directional axis, and partial flat portions extending in the second directional axis may be bent several times on a plane defined by the first directional axis and the second directional axis.

The partial flat portions may be bent to correspond to the recessed portions on the plane.

The rest of the flat portions except for portions of the flat portions may be bent several times in the second directional axis on the plane.

An exemplary embodiment also discloses a method of manufacturing a flexible display device, the method includes: providing a display panel including a substrate, a circuit layer, an element layer, and an encapsulation layer and divided into emission areas and a non-emission area; forming a buffer layer including recessed portions each of which has a groove overlapping a corresponding emission area of the emission areas and flat portions connecting the recessed portions to each other on the encapsulation layer; and forming a touch sensing part including conductive patterns and an insulation layer covering the conductive patterns on the buffer layer.

The forming of the buffer layer may include: forming a preliminary buffer layer on the encapsulation layer; and forming the groove overlapping the corresponding emission area by using a mask including a plurality of transmission portions and a plurality of slit portions.

The forming of the touch sensing part may include: forming conductive patterns on the flat portions; forming a preliminary insulation layer; and forming insulation grooves arranged in a one-to-one correspondence with the grooves on the preliminary insulation layer by using the mask.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 9B is a cross-sectional view illustrating portion CC taken along line III-III'.

FIG. 13A, FIG. 13B, FIG. 13C, FIG. 13D, FIG. 13E, FIG. 13F, FIG. 13G, FIG. 13H, FIG. 13I, and FIG. 13J are cross-sectional views for explaining a method of manufacturing the flexible display device according to an exemplary embodiment.

DETAILED DESCRIPTION OF THE ILLUSTRATED EMBODIMENTS

Figure 1A:
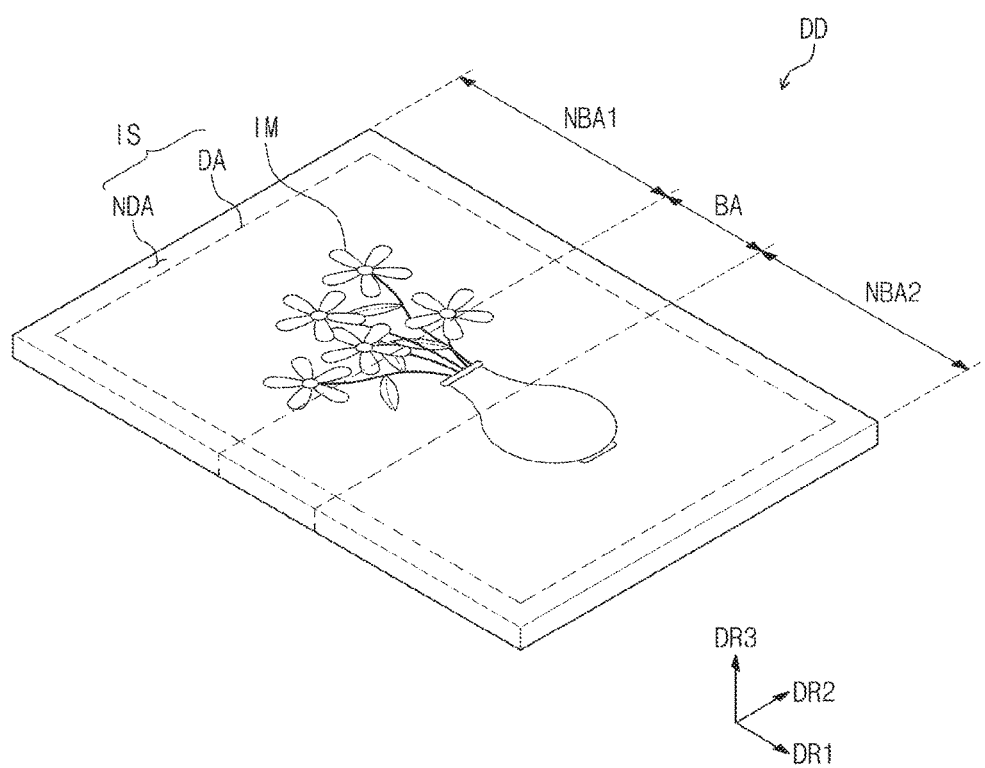
FIG. 1A is a perspective view illustrating a first operation of a flexible display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, exemplary embodiments of the present invention will be described with reference to the accompanying drawings. In the drawings, the dimensions of layers and regions are exaggerated for clarity of illustration. Like reference numerals refer to like elements throughout.

It will also be understood that when a layer is referred to as being "on" another layer or substrate, it can be directly on the other layer or substrate, or intervening layers may also be present. Furthermore, although one surface of a layer is illustrated to be flat, it is not necessarily required to be flat but a stepped portion may exist on a surface of an upper layer due to a surface morphology of an underlying layer during a stacking process.

Figure 1B:
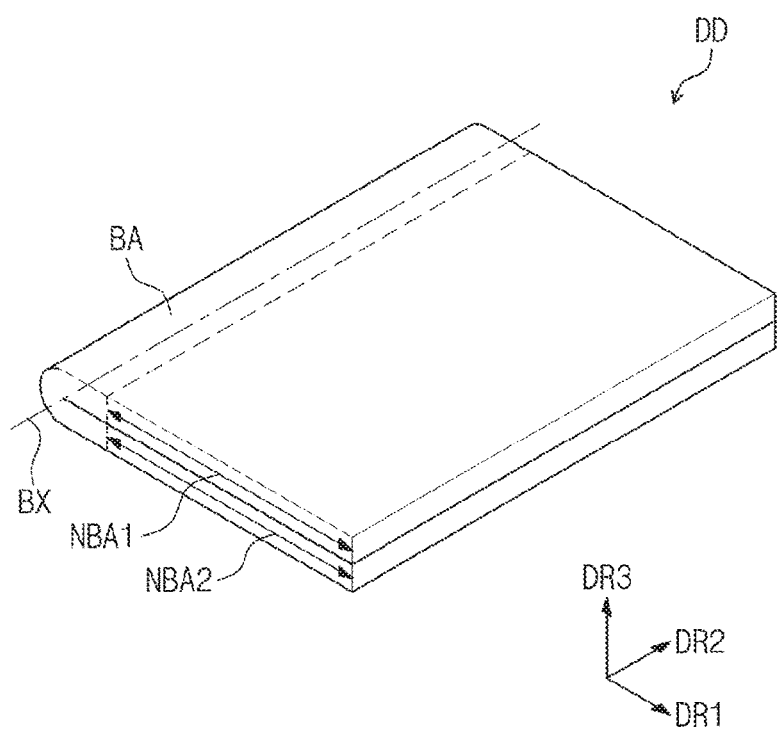
FIG. 1B is a perspective view illustrating a second operation of the flexible display device according to an exemplary embodiment.
Figure 2A:
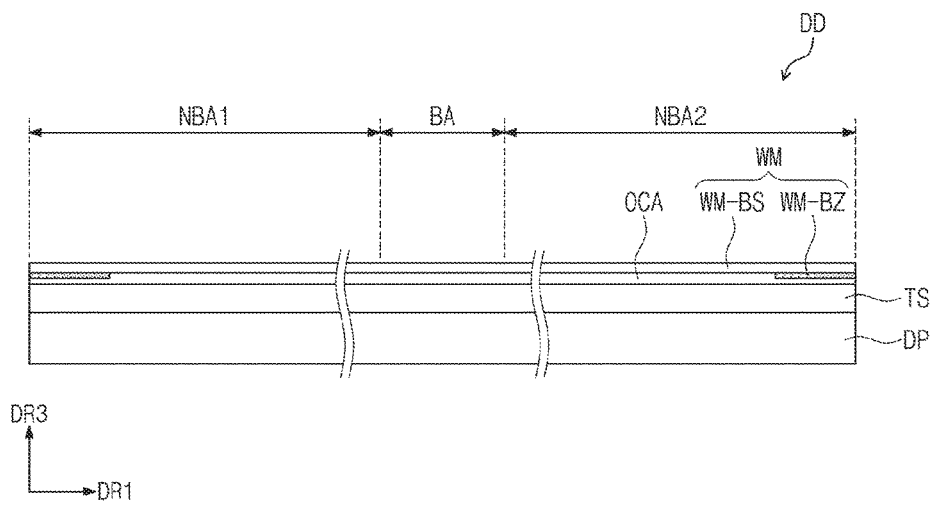
FIG. 2A is a cross-sectional view illustrating the first operation of the flexible display device according to an exemplary embodiment.
Figure 2B:
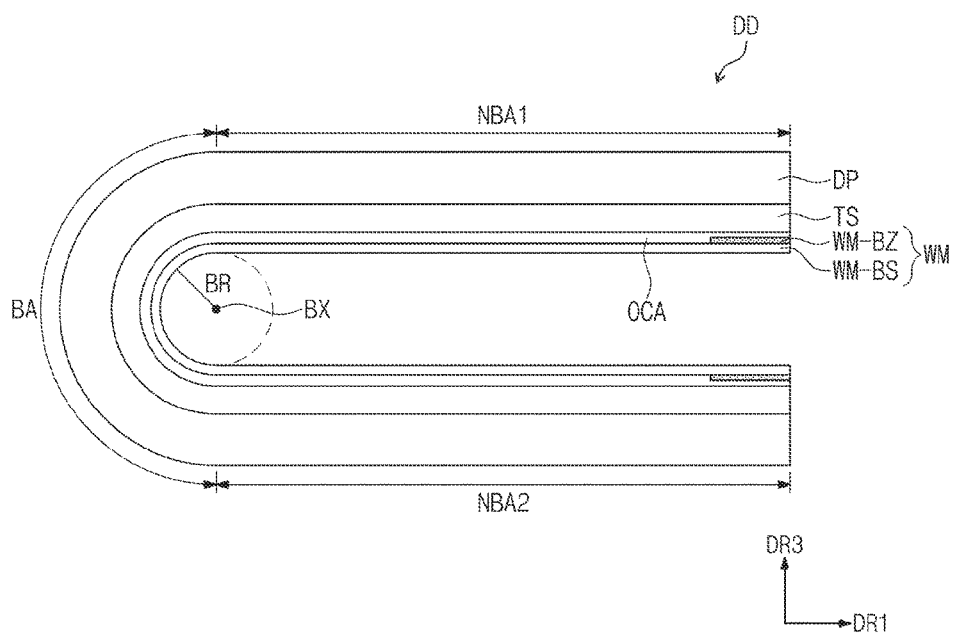
FIG. 2B is a cross-sectional view illustrating the second operation of the flexible display device according to an exemplary embodiment.

FIG. 1A is a perspective view illustrating a first operation of a flexible display device DD according to an exemplary embodiment. FIG. 1B is a perspective view illustrating a second operation of the flexible display device DD according to an exemplary embodiment. FIG. 2A is a cross-sectional view illustrating the first operation of the flexible display device DD according to an exemplary embodiment. FIG. 2B is a cross-sectional view illustrating the second operation of the flexible display device DD according to an exemplary embodiment.

Referring to FIG. 1A, a display surface IS for displaying an image IM is parallel to a surface defined by a first directional axis DR1 and a second direction axis DR2. A normal direction of the display surface IS (i.e., a thickness direction of the flexible display device DD) indicates a third directional axis DR3. Front and rear surfaces of each member may be defined by a third directional axis DR3. However, directions respectively indicated by the first to third directional axes DR1 to DR3 may be a relative concept, and thus, may be changed with respect to each other. Hereinafter, first to third directions are respectively indicated by the first, second, and third directional axes DR1, DR2, and DR3 and referred as the same reference numerals.

FIGS. 1A to 2B illustrate a foldable display device as an example of the flexible display device DD. However, the inventive concept is not limited to the kind of the display device DD. For example, the flexible display device DD may include a curved flexible display device having a predetermined curvature or a rollable flexible display device capable of being rolled. Although not shown, the flexible display device DD according to an exemplary embodiment may be used for a small and medium sized electronic device, such as a mobile phone, a tablet, a vehicle navigation unit, a game console, and a smart watch, as well as a large sized electronic device, such as a television and a monitor.

As illustrated in FIG. 1A, the display surface IS of the flexible display device DD may be divided into a plurality of areas. The flexible display device DD includes a display area DA for displaying an image IM and a non-display area NDA disposed adjacent to the display area DA. The non-display area NDA is an area on which an image may not be displayed. In FIG. 1A, a vase is illustrated as an example of the image IM displayed. For example, the display area DA may have a rectangular shape. The non-display area NDA may surround the display area DA. However, the inventive concept is not limited to the shapes of the display area DA and the non-display area NDA. For example, the shapes of the display area DA and the non-display area NDA may be relatively designed.

As illustrated in FIGS. 1A and 1B, the display device DD may be defined by a bending area BA configured to be bent along a bending axis BX, and first and second bending areas NBA1 and NBA2 that are not bent. The display surface IS of the first non-bending area NBA1 may face the display surface IS of the second non-bending area NBA2 by means of inner-bending. Alternatively, outer-bending may be performed on the display device DD according to a user's operation.

According to an exemplary embodiment, the display device DD may include a plurality of bending areas BA. In addition, the bending area BA may be defined corresponding to a type of a user's operation on the display device DD. For example, the bending area BA may be defined parallel to the first directional axis DR1 or in a diagonal direction as opposed to the display device DD illustrated in FIG. 1B. A surface area of the bending area BA may not be constant, and may be determined according to a bending radius BR (see FIG. 2A).

As illustrated in FIGS. 2A and 2B, the display device DD may include a display panel DP, a touch sensing part TS, and a window member WM. Each of the display panel DP, the touch sensing part TS, and the window member WM may be flexible. Although not shown, the display device DD may further include a protection member coupled to the window member WM to protect the display panel DP and the touch sensing part TS. According to an exemplary embodiment, the window member WM may be omitted or integrated in the touch sensing part TS.

The display panel DP generates the image IM (see FIG. 1A) corresponding to an input image data. The display panel DP may include an organic light emitting display panel, an electrophoretic display panel, and an electrowetting display panel. However, the inventive concept is not limited to the kind of the display panel DP. Hereinafter, the display panel will be described with reference to the organic light emitting display panel. Detailed description regarding the organic light emitting display panel will be described later.

The touch sensing part TS may obtain coordinate information of external input. The touch sensing part TS is disposed on a base surface of the display panel DP. The touch sensing part TS and the display panel DP may be manufactured in a continuous process. Accordingly, an adhesion member disposed between the touch sensing part TS and the display panel DP may be omitted.

The touch sensing part TS may be a capacitive type touch sensing part. However, the inventive concept is not limited the type of the touch sensing part TS. For example, the touch sensing part TS may be operated by another type of touch sensing part TS including two types of touch electrodes, such as an electromagnetic induction method.

The window member WM may be coupled to the touch sensing part TS by an optically clear adhesive film (OCA). The window member WM includes a base member WM-BS and a bezel layer WM-BZ. The base member WM-BS may include a plastic film or the like. The bezel layer WM-BZ partially overlaps the base member WM-BS. The bezel layer WM-BZ may be disposed on a rear surface of the base member WM-BS to define a bezel area (e.g., the non-display area NDA of FIG. 1A) of the display device DD.

The bezel layer WM-BZ may be a colored organic layer and formed by, e.g., a coating method. Although not shown, the window member WM may further include a functional coating layer disposed on a front surface of the base member WM-BS. The functional coating layer may include a fingerprint proof layer, a reflection proof layer, and a hard coating layer.

Figure 3A:
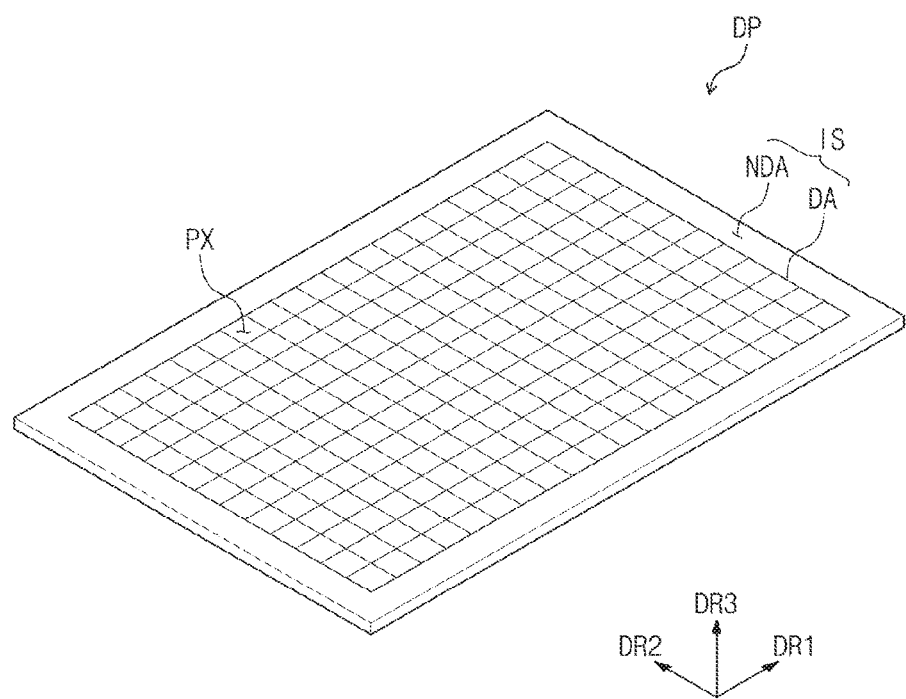
FIG. 3A is a perspective view illustrating a flexible display panel according to an exemplary embodiment.
Figure 3B:
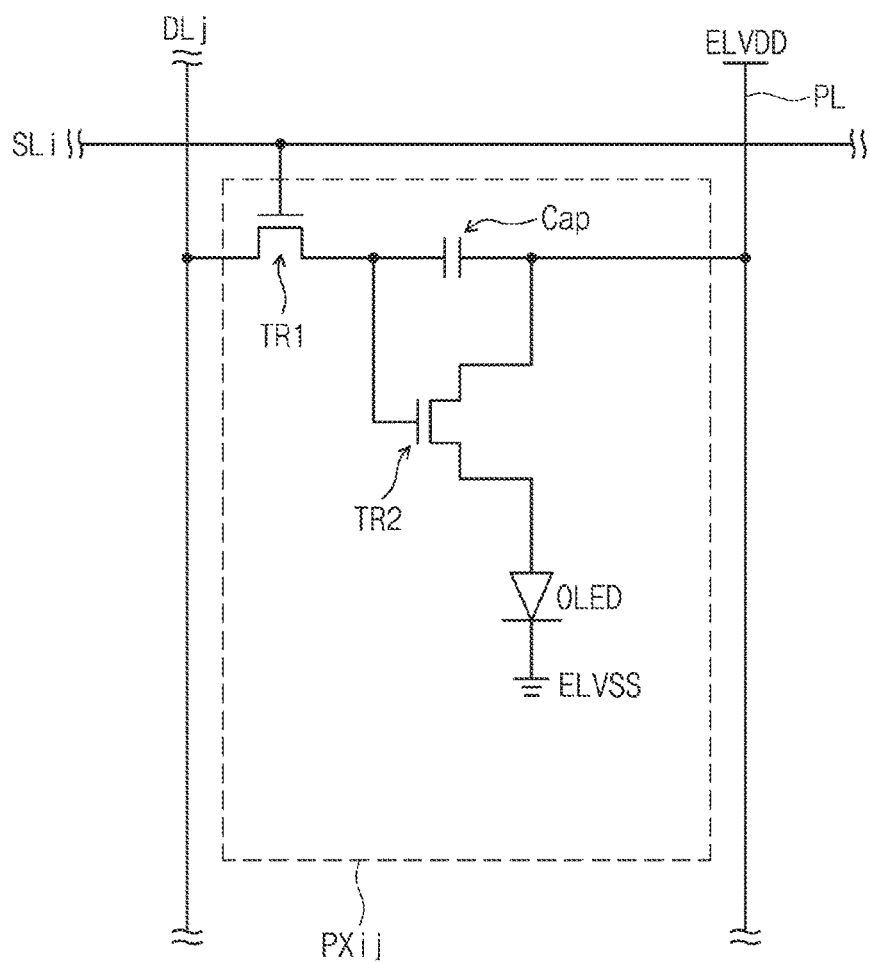
FIG. 3B is an equivalent circuit diagram illustrating a pixel according to an exemplary embodiment.

FIG. 3A is a perspective view of a flexible display panel DP according to an exemplary embodiment. FIG. 3B is an equivalent circuit diagram of a pixel PX according to an exemplary embodiment. Hereinafter, the flexible display panel DP will be described as an organic light emitting display panel DP. The organic light emitting display panel DP includes the display area DA and the non-display area NDA. The display area DA and the non-display area NDA of the organic light emitting display panel DP may not necessarily be the same as the display area DA and the non-display area NDA of the display device DD, which are defined by the bezel layer WM-BZ. As such, the display area DA and the non-display area NDA of the organic light emitting display panel DP may be varied according to a structure or a design of the organic light emitting display panel DP.

As illustrated in FIG. 3A, the organic light emitting display panel DP includes a plurality of pixels PX disposed on the display area DA. Although the plurality of pixels PX are illustrated to be arranged in a matrix form, the inventive concept is not limited thereto. For example, the plurality of pixels PX may be disposed in a non-matrix form, e.g., a pentile form.

FIG. 3B illustrates an equivalent circuit of one pixel PXij connected to i-th injection line SLi and a j-th source line DLj according to an exemplary embodiment. Although not shown, the plurality pixels PX may have the same equivalent circuit.

The pixel PXij includes at least one transistor TR1 or TR2, at least one capacitor Cap, and an organic light emitting diode OLED. Although FIG. 3B illustrates that a pixel driving circuit includes two transistors TR1 and TR2 and one capacitor Cap, the constitution of the pixel driving circuit is not limited thereto and may be varied.

An anode of the organic light emitting diode OLED receives a first power voltage ELVDD applied to a power line PL through the second transistor TR2. A cathode of the organic light emitting diode OLED receives a second power voltage ELVSS. The first transistor TR1 outputs a data signal applied to the j-th source line DLj in response to an injection signal applied to the i-th injection line SLi. The capacitor Cap charges a voltage corresponding to the data signal received from the first transistor TR1. The second transistor TR2 controls driving current flowing in the organic light emitting diode OLED in correspondence with the voltage stored in the capacitor Cap.

Figure 4A:
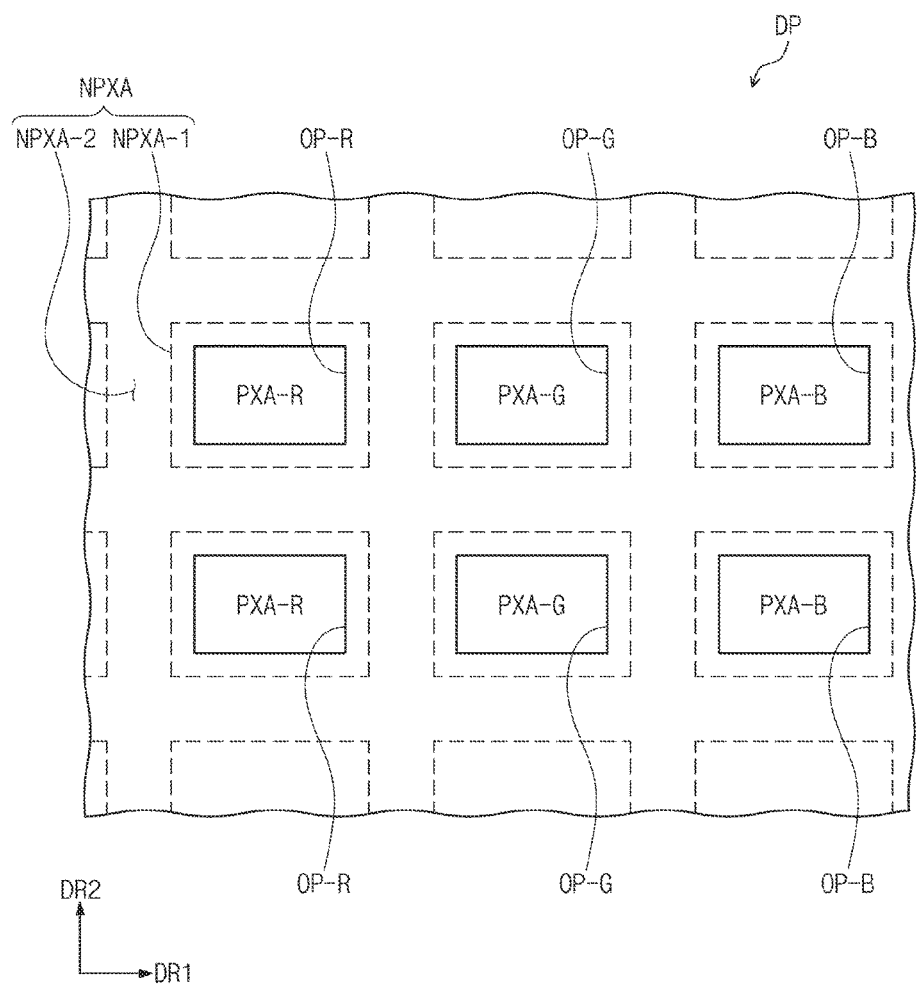
FIG. 4A is a partial plan view illustrating an organic light emitting display panel according to an exemplary embodiment.
Figure 4B:
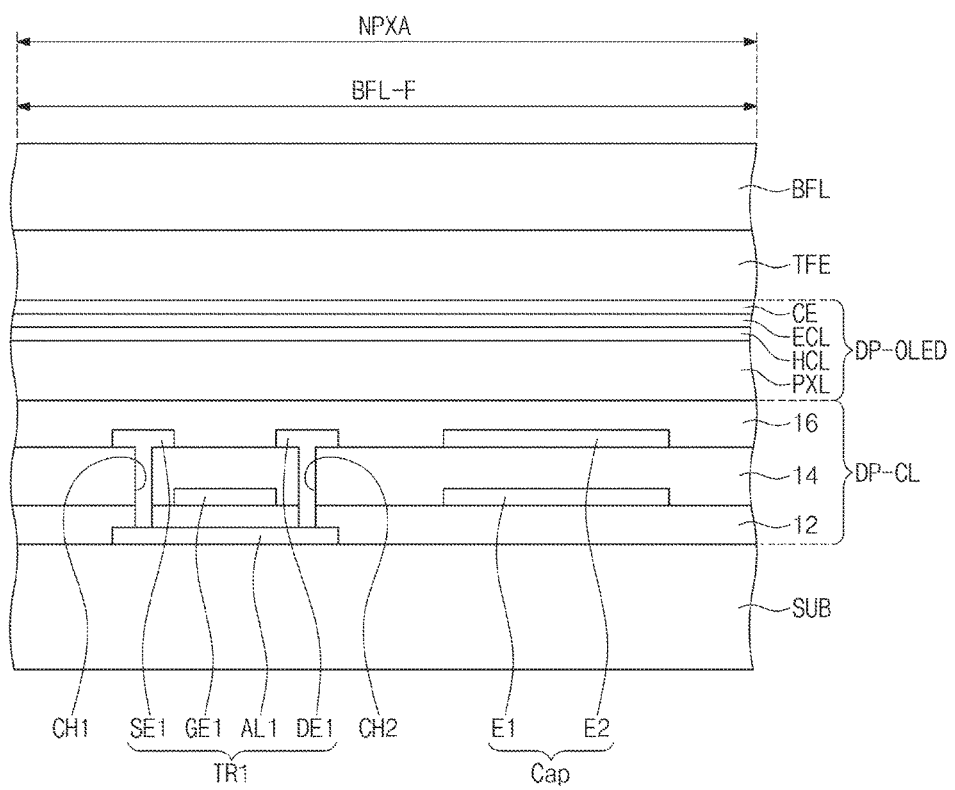
FIG. 4B and FIG. 4C are partial cross-sectional views illustrating the organic light emitting display panel according to an exemplary embodiment.
Figure 4C:
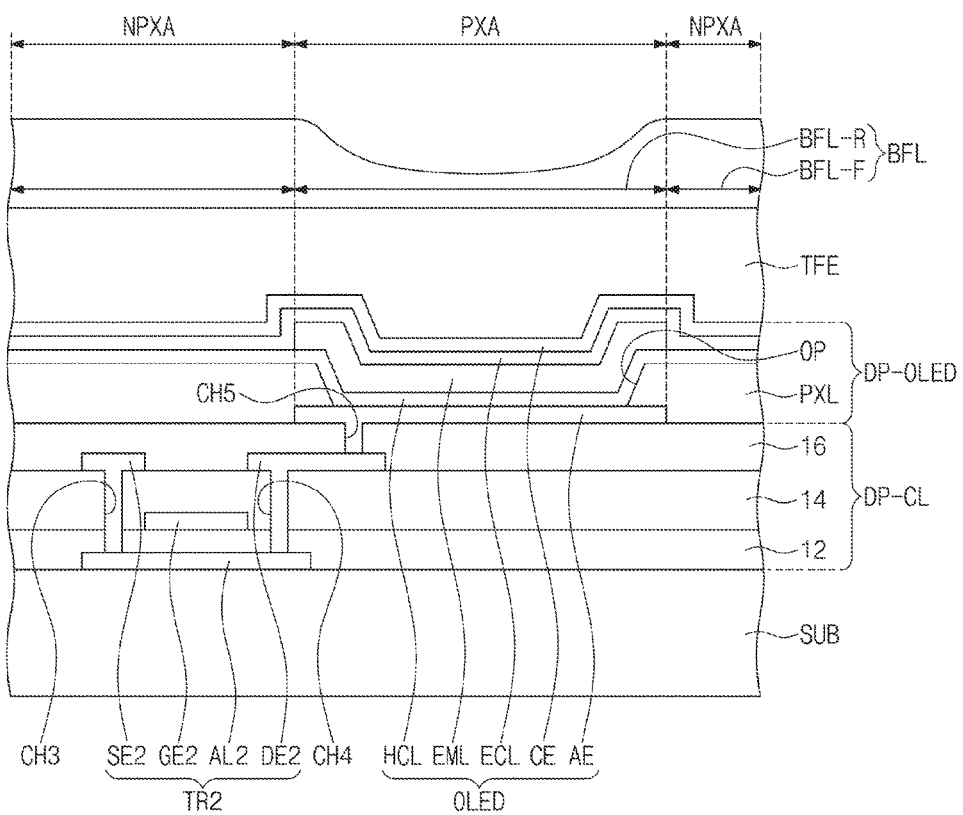

FIG. 4A is a partial plan view illustrating the organic light emitting display panel DP according to an exemplary embodiment. FIGS. 4B and 4C are partial cross-sectional views illustrating the organic light emitting display panel DP according to an exemplary embodiment. FIG. 4A illustrates a portion of the display area DA (refer to FIG. 3A). FIG. 4B illustrates a cross-section of a portion corresponding to the first transistor TR1 and the capacitor Cap of the equivalent circuit illustrated in FIG. 3B, and FIG. 4C illustrates a cross-section of a portion corresponding to the second transistor TR2 and the organic light emitting diode OLED of the equivalent circuit illustrated in FIG. 3B.

As illustrated in FIG. 4A, the organic light emitting display panel DP is divided into a plurality of light emitting areas PXA-R, PXA-G, and PXA-B, and a non-light emitting area NPXA disposed on a plane defined by the first directional axis DR1 and the second directional axis DR2. In FIG. 4A, three types of light emitting areas PXA-R, PXA-G, and PXA-B are disposed in a matrix form as an example. Organic light emitting diodes emitting three different colors from each other may be disposed on the three types of light emitting areas PXA-R, PXA-G, and PXA-B, respectively. According to an exemplary embodiment, organic light emitting diodes emitting white-color light may be disposed on each of the three types of light emitting areas PXA-R, PXA-G, and PXA-B.

The non-light emitting area NPXA may be divided into first non-light emitting areas NPXA-1 surrounding the light emitting areas PXA-R, PXA-G, and PXA-B, and second non-light emitting area NPXA-2 disposed between the first non-light emitting areas NPXA-1. The driving circuit of a sub-pixel corresponding to each of the first non-light emitting areas NPXA-1 (e.g., the transistors TR1 and TR2 (refer to FIG. 3B) or the capacitor Cap (refer to FIG. 3B) may be disposed on each of the non-light emitting areas NPXA-1. The signal lines (e.g., the injection line SLi (refer to FIG. 3B), the source line DLj (refer to FIG. 3B), and the power line PL (refer to FIG. 3B)) may be disposed on the second non-light emitting area NPXA-2. However, the inventive concept is not limited thereto. For example, the first non-light emitting areas NPXA-1 and the second non-light emitting area NPXA-2 may not be separated from each other.

Although not shown, according to an exemplary embodiment, each of the light emitting areas PXA-R, PXA-G, and PXA-B may have a shape similar to a rhombus. According to an exemplary embodiment, four organic light emitting diodes each emitting different colored light may be respectively disposed on the four types of light emitting areas that are repeatedly disposed.

As used herein, "a light emitting area emits predetermined colored light" may refer to directly emitting the light generated from the corresponding light emitting diode or converting the color of light generated from the corresponding light emitting diode to emit the converted light.

As illustrated in FIGS. 4B and 4C, the organic light emitting display panel layer DP includes a base substrate SUB, a circuit layer DP-CL, an organic light emitting diode layer DP-OLED, and a thin film encapsulation layer TFE. The circuit layer DP-CL may include a plurality of conductive layers and a plurality of insulation layers, and the organic light emitting diode layer DP-OLED may include a plurality of conductive layers and a plurality of functional organic layers.

The base substrate SUB may be flexible and include a plastic substrate, such as a polyimide substrate, a glass substrate, and a metal substrate. A semiconductor pattern AL1 (hereinafter, "a first semiconductor pattern") of the first transistor TR1 and a semiconductor pattern AL2 (hereinafter, "a second semiconductor pattern") of the second transistor TR2 are disposed on the base substrate SUB. The first semiconductor pattern AL1 and the second semiconductor pattern AL2 may include amorphous silicon formed at a low temperature. Additionally or alternatively, the first semiconductor pattern AL1 and the second semiconductor pattern AL2 may include a metal oxide semiconductor. Although not shown, functional layers may be further disposed on one surface of the base substrate SUB. Each of the functional layers includes at least one of a barrier layer or a buffer layer. The first semiconductor pattern AL1 and the second semiconductor pattern AL2 may be disposed on the barrier layer or the buffer layer.

A first insulation layer 12 covering the first semiconductor pattern AL1 and the second semiconductor pattern AL2 is disposed on the base substrate SUB. The first insulation layer 12 includes an organic layer and/or an inorganic layer. In particular, the first insulation layer 12 may include a plurality of inorganic thin films. Each of the plurality of inorganic thin films may include a silicon nitride layer and a silicon oxide layer.

A control electrode GE1 (hereinafter, "a first control electrode") of the first transistor TR1 and a control electrode GE2 (hereinafter, "a second control electrode") of the second transistor TR2 are disposed on the first insulation layer 12. A first electrode E1 of the capacitor Cap is disposed on the first insulation layer 12. The first control electrode GE1, the second control electrode GE2, and the first electrode E1 may be manufactured by the same photolithography process as that of the injection line SLi (refer to FIG. 3B). In other words, the first electrode E1 may include the same material as the injection line.

A second insulation layer 14 covering the first control electrode GE1, the second control electrode GE2, and the first electrode E1 is disposed on the first insulation layer 12. The second insulation layer 14 includes an organic layer and/or an inorganic layer. In particular, the second insulation layer 14 may include a plurality of inorganic thin films. Each of the plurality of inorganic thin films may include a silicon nitride layer and a silicon oxide layer.

The source line DLj (refer to FIG. 3B) and the power line PL (refer to FIG. 3B) may be disposed on the second insulation layer 14. An input electrode SE1 (hereinafter, "a first input electrode") and an output electrode DE1 (hereinafter, "a first output electrode") of the first transistor TR1 are disposed on the second insulation layer 14. An input electrode SE2 (hereinafter, "a second input electrode") and an output electrode DE2 (hereinafter, "a first output electrode") of the second transistor TR2 are disposed on the second insulation layer 14. The first input electrode SE1 is branched from the source line DLj. The second input electrode SE2 is branched from the power line PL.

A second electrode E2 of the capacitor Cap is disposed on the second insulation layer 14. The second electrode E2 may be manufactured by the same photolithography process as that of the source line DLj and the power line PL, and made include the same material as the source line DLj and the power line PL.

The first input electrode SE1 and the first output electrode DE1 are connected to the first semiconductor pattern AL1, respectively, through a first through-hole CH1 and a second through-hole CH2, which pass through the first insulation layer 12 and the second insulation layer 14. The first output electrode DE1 may be electrically connected to the first electrode E1. For example, the first output electrode DE1 may be connected to the first electrode E1 through a through-hole (not shown) passing through the second insulation layer 14. The second input electrode SE2 and the second output electrode DE2 are connected to the second semiconductor pattern AL2, respectively, through a third through-hole CH3 and a fourth through-hole CH4, which pass through the first insulation layer 12 and the second insulation layer 14. Meanwhile, according to an exemplary embodiment, the first transistor TR1 and the second transistor TR2 may alternatively be embodied in a bottom gate structure.

A third insulation layer 16 covering the first input electrode SE1, the first output electrode DE1, the second input electrode SE2, and the second output electrode DE2 is disposed on the second insulation layer 14. The third insulation layer 16 includes an organic layer and/or an inorganic layer. In particular, the third insulation layer 16 may include an organic material to provide a flat surface.

A pixel defining film PXL and an organic light emitting diode OLED are disposed on the third insulation layer 16. An opening OP is defined in the pixel defining film PXL. The pixel defining film PXL may function as another insulation layer. The opening OP in FIG. 4C may correspond to the openings OP-R, OP-G, and OP-B in FIG. 4A.

An anode AE is connected to the second output electrode DE2 through a fifth through-hole CH5 passing through the third insulation layer 16. The opening OP of the pixel defining film PXL may expose at least a portion of the anode AE. A hole control layer HCL may be commonly defined in the light emitting areas PXA-R, PXA-G, and PXA-B (refer to FIG. 4A) and the non-light emitting area NPXA (refer to FIG. 4A). An organic light emitting layer EML and an electron control layer ECL may be sequentially provided on the hole control layer HCL. Thereafter, the cathode CE may be commonly defined in the light emitting areas PXA-R, PXA-G, and PXA-B, and the non-light emitting area NPXA. The cathode CE may be formed by a deposition or sputtering method according to a layer structure thereof.

The light emitting area PXA may be defined as an area generating light. In an exemplary embodiment, the light emitting area PXA may be defined corresponding to the anode AE or the light emitting layer EML of the organic light emitting diode OLED.

The thin film encapsulation layer TFE encapsulating the organic light emitting diode layer DP-OLED is disposed on the cathode CE. Although the thin film encapsulation layer TFE is illustrated as a single layer in FIGS. 4B and 4C, however, the thin film encapsulation layer TFE may include at least two inorganic thin films and an organic thin film disposed therebetween. The inorganic thin films protect the organic light emitting diode OLED from moisture, and the organic thin film protects the organic light emitting diode OLED from foreign substances such as dust particles.

For example, the thin film encapsulation layer TFE may include "n" inorganic thin films and "n" organic thin films. Here, the "n" organic thin films and the "n" inorganic thin films may be alternately disposed, and a layer disposed at the uppermost layer may be an organic layer or an inorganic layer. The "n" organic thin films may have a thickness greater than that of the "n" inorganic thin films.

Each of the "n" inorganic thin films may have a single layer including one material or double layers including different materials from each other. Each of the "n" organic thin films may be formed by depositing organic monomers. The organic monomers may include an acrylic-based monomer.

In an exemplary embodiment, a buffer layer BFL may be disposed on the thin film encapsulation layer TFE. The material of the buffer layer BFL may be varied according to a purpose thereof. For example, the buffer layer BFL may be an organic layer or an inorganic layer for matching a refractive index.

The buffer layer BFL may overlap the light emitting area PXA and the non-light emitting area NPXA. The buffer layer BFL according to an exemplary embodiment may include a flat portion BFL-F overlapping the non-emission area NPXA and a recessed portion BFL-R overlapping the light emitting area PXA. The recessed portion BFL-R may include a top surface in which a groove is defined.

Figure 5:
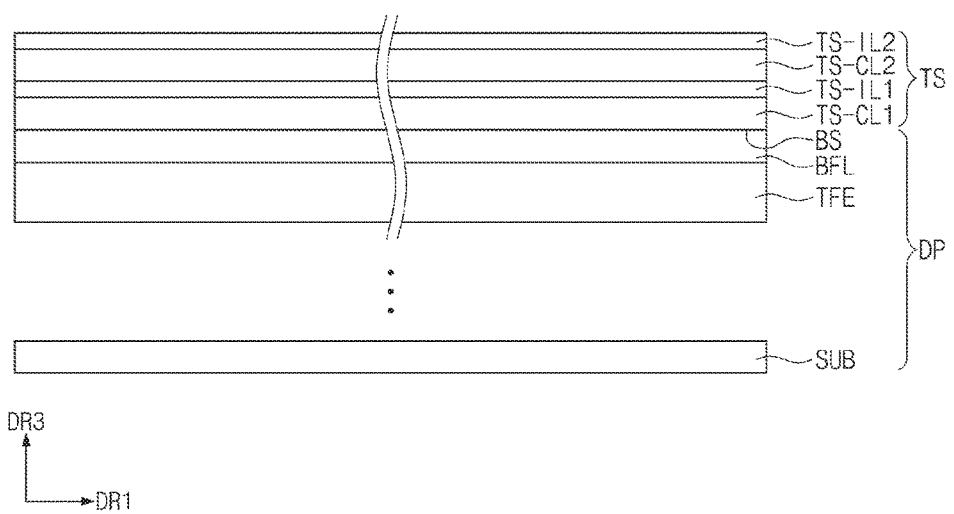
FIG. 5 is a cross-sectional view illustrating the flexible display device according to an exemplary embodiment.

FIG. 5 is a cross-sectional view illustrating the flexible display device DD according to an exemplary embodiment.

In FIG. 5, a display panel DP is simply illustrated. As illustrated in FIG. 5, a touch sensing part TS includes a first conductive layer TS-CL1, a first insulation layer TS-IL1, a second conductive layer TS-CL2, and a second insulation layer TS-IL2. Each of the first conductive layer TS-CL1 and the second conductive layer TS-CL2 may have a single layer structure or a multi-layer structure laminated in a third directional axis DR3. The conductive layer having the multi-layer structure may include a transparent conductive layer and at least one metal layer. The transparent conductive layer may include an indium tin oxide (ITO), an indium zinc oxide (IZO), a zinc oxide (ZnO), an indium tin zinc oxide (ITZO), PEDOT, a metallic nanowire, and graphene. The metal layer may include molybdenum, silver, titanium, copper, aluminum, and an alloy thereof. Each of the first conductive layer TS-CL1 and the second conductive layer TS-CL2 includes a plurality of conductive patterns. Hereinafter, the first conductive layer TS-CL1 includes first conductive patterns, and the second conductive layer TS-CL2 includes second conductive patterns. Each of the first conductive patterns and the second conductive patterns may include touch electrodes and touch signal lines.

In an exemplary embodiment, each of the first insulation layer TS-IL1 and the second insulation layer TS-IL2 may include at least one of an inorganic layer or an organic layer. In particular, the organic layer may provide a flat surface. The inorganic material may include a silicon oxide or a silicon nitride. The organic material may include at least one of an acrylic-based resin, a methacryl-based resin, polyisoprene, a vinyl-based resin, an epoxy-based resin, a urethane-based resin, a cellulose-based resin, and a perylene-based resin.

As described above in FIGS. 4B and 4C, the display panel DP according to an exemplary embodiment may further include a buffer layer BFL disposed on a thin film encapsulation layer TFE. The buffer layer BFL provides a base surface BS to the touch sensing part TS.

Figure 6A:
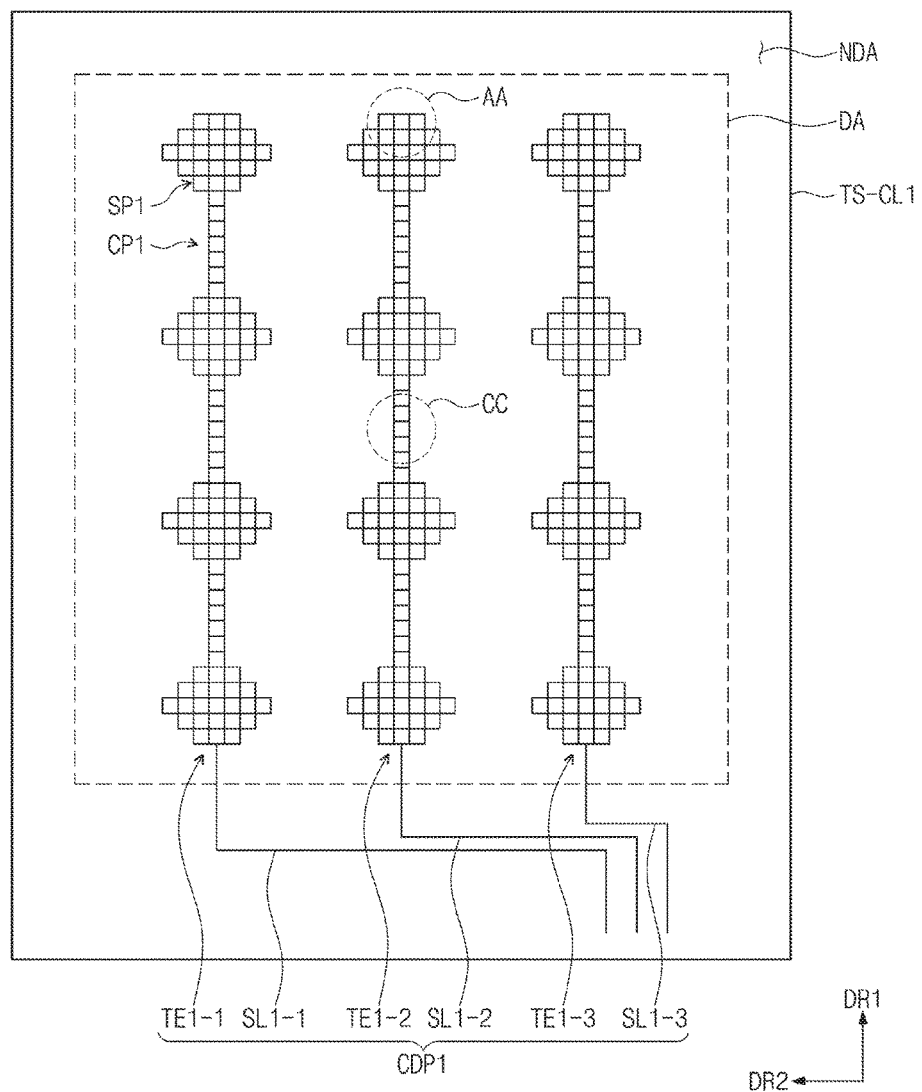
FIG. 6A is a plan view illustrating a first conductive layer of a touch sensing part according to an exemplary embodiment.
Figure 6B:
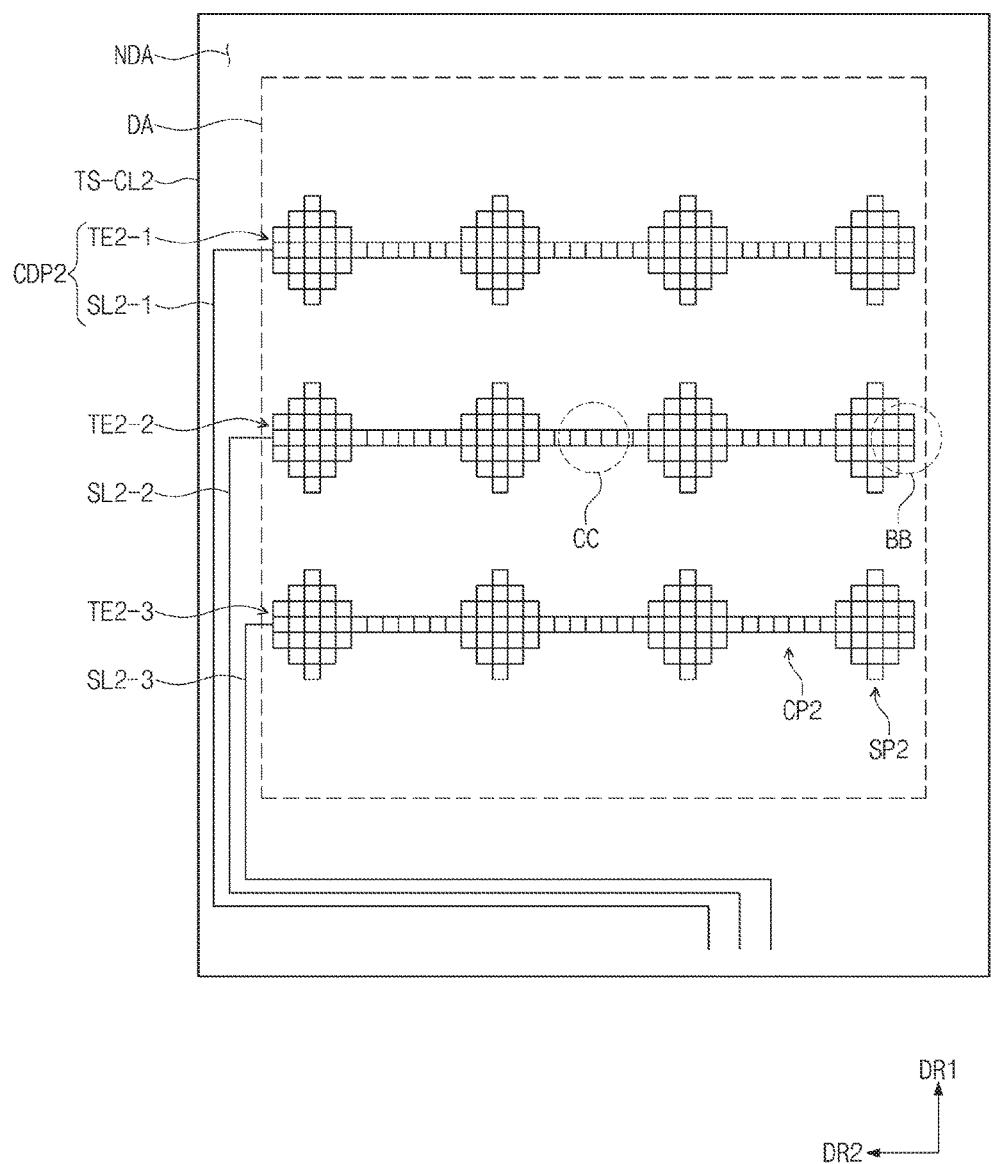
FIG. 6B is a plan view illustrating a second conductive layer of the touch sensing part according to an exemplary embodiment.

FIG. 6A is a plan view illustrating the first conductive layer TS-CL1 of the touch sensing part TS according to an exemplary embodiment, and FIG. 6B is a plan view illustrating the second conductive layer TS-CL2 of the touch sensing part TS according to an exemplary embodiment.

In FIGS. 6A and 6B, the touch sensing part TS is described with reference to a 2-layer capacitive type touch sensing part. However, the inventive concept is not limited thereto. The 2-layer capacitive type touch sensing part may obtain coordinate information of a touched position in a self capacitance method or a mutual capacitance method. A driving method of the touch sensing part for obtaining the coordinate information is not especially limited.

As illustrated in FIG. 6A, the first conductive layer TS-CL1 may include first conductive patterns CDP1, and the first conductive patterns CDP1 may include first touch electrodes TE1-1 to TE1-3 and first touch signal lines SL1-1 to SL1-3. FIG. 6A exemplarily illustrates three first touch electrodes TE1-1 to TE1-3 and the first touch signal lines SL1-1 to SL1-3 respectively connected thereto.

The first touch electrodes TE1-1 to TE1-3 extend in a first directional axis DR1 and are arranged in a second directional axis DR2. Each of the first touch electrodes TE1-1 to TE1-3 has a mesh shape in which a plurality of touch openings are defined. Detailed description regarding the mesh shape will be described later in FIG. 6B.

Each of the first touch electrodes TE1-1 to TE1-3 includes a plurality of first sensor parts SP1 and a plurality of first connecting parts CP1. The first sensor parts SP1 are arranged in the first directional axis DR1. Each of the first connecting parts CP1 connects two adjacent first sensor parts SP1 of the first sensor parts SP1.

Although not specifically shown, each of the first touch signal lines SL1-1 to SL1-3 according to an exemplary embodiment may also have the mesh shape. Each of the first touch signal lines SL1-1 to SL1-3 may have the same layer structure as that of each of the first touch electrodes TE1-1 to TE1-3.

As illustrated in FIG. 6B, a second conductive layer TS-CL2 may include second conductive patterns CDP2, and the second conductive patterns CDP2 may include second touch electrodes TE2-1 to TE2-3 and second touch signal lines SL2-1 to SL2-3. FIG. 6B exemplarily illustrates three second touch electrodes TE2-1 to TE2-3 and the second touch signal lines SL2-1 to SL2-3 respectively connected thereto.

Each of the second touch electrodes TE2-1 to TE2-3 extends in the second directional axis DR2 and is arranged in the first directional axis DR1. The second touch electrodes TE2-1 to TE2-3 cross the first touch electrodes TE1-1 to TE1-3 and are insulated from the first touch electrodes TE1-1 to TE1-3. Each of the second touch electrodes TE2-1 to TE2-3 has a mesh shape in which a plurality of touch openings are defined.

Each of the second touch electrodes TE2-1 to TE2-3 includes a plurality of second sensor parts SP2 and a plurality of second connecting parts CP2. The second sensor parts SP2 are arranged in the second directional axis DR2. Each of the second connecting parts CP2 connects two adjacent second sensor parts SP2 of the second sensor parts SP2.

Although not specifically shown in the drawing, each of the second touch signal lines SL2-1 to SL2-3 may also have the mesh shape. Each of the second touch signal lines SL2-1 to SL2-3 may have the same layer structure as that of each of the second touch electrodes TE2-1 to TE2-3.

The first touch electrodes TE1-1 to TE1-3 are capacitively coupled to the second touch electrodes TE2-1 to TE2-3, respectively. As touch sensing signals are applied to the first touch electrodes TE1-1 to TE1-3, capacitors are provided between the first sensor parts SP1 and the second sensor parts SP2.

However, the inventive concept is not limited to the shape of each of the first touch electrodes TE1-1 to TE1-3 and the second touch electrodes TE2-1 to TE2-3, which include the sensor part and the connecting part. More particularly, the connecting part may only need to be defined as a portion in which the first touch electrodes TE1-1 to TE1-3 cross the second touch electrodes TE2-1 to TE2-3, and the sensor part may only need to be defined as a portion in which the first touch electrodes TE1-1 to TE1-3 do not overlap the second touch electrodes TE2-1 to TE2-3. For example, each of the first touch electrodes TE1-1 to TE1-3 and the second touch electrodes TE2-1 to TE2-3 may have a bar shape having a predetermined width.

Figure 7A:
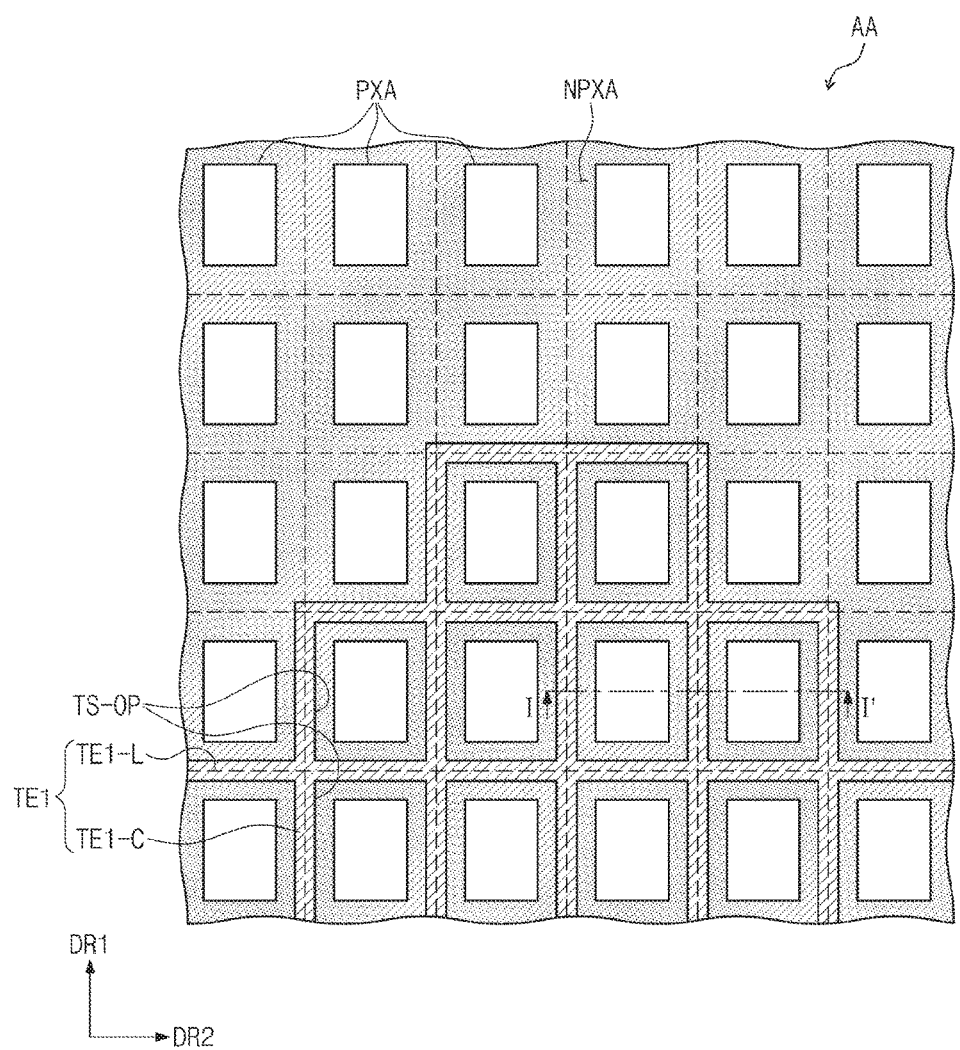
FIG. 7A is an enlarged view illustrating portion AA of FIG. 6A.
Figure 7B:
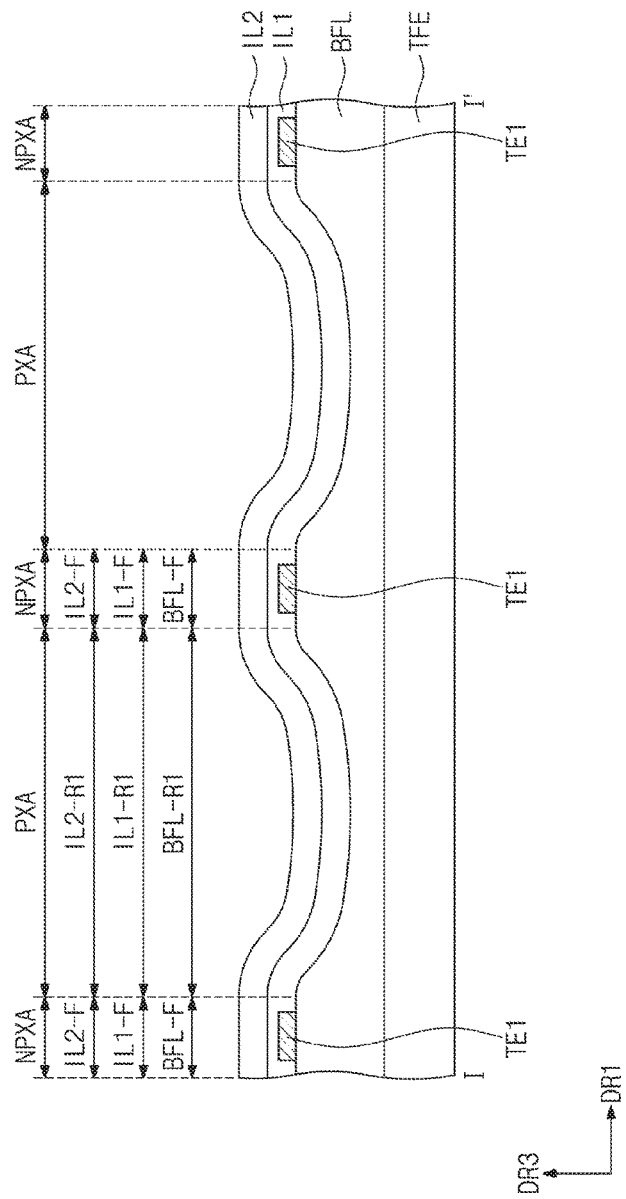
FIG. 7B is a partial cross-sectional view illustrating the display device taken along line I-I' of FIG. 7A.

FIG. 7A is a partial enlarged view of area AA in FIG. 6A, and FIG. 7B is a partial cross-sectional view of the display device taken along line I-I' in FIG. 7A.

As illustrated in FIG. 7A, the first touch electrodes TE1 overlaps a non-emission area NPXA disposed adjacent to the emission area PXA. The first touch electrodes TE1 include a plurality of first vertical portions TE1-C extending in the first directional axis DR1 and a plurality of horizontal portions TE1-L extending in the second directional axis DR2. The plurality of first vertical portions TE1-C and the plurality of horizontal portions TE1-L may be defined as a mesh line. The mesh line may have a line width of several micrometers (μm).

The plurality of first vertical portions TE1-C and the plurality of horizontal portions TE1-L are connected to each other to provide a plurality of touch openings TS-OP. In particular, the first touch electrodes TE1 have a mesh shape including the plurality of touch openings TS-OP. Although the touch openings TS-OP each correspond to each of the emission areas PXA, however, the inventive concept is not limited thereto. For example, one touch opening TS-OP may correspond to two or more emission areas PXA.

Referring to FIG. 7B, the buffer layer BFL according to an exemplary embodiment may include flat portions BFL-F overlapping the non-emission area NPXA and recessed portions BFL-R1 overlapping the corresponding emission area PXA of the emission areas. The flat portions BFL-F may connect two adjacent recessed portions BFL-R1 to each other. The first conductive patterns may be disposed on the flat portions BFL-F of the buffer layer BFL. FIG. 7B illustrates that the first touch electrodes TE1 of the first conductive patterns are respectively disposed on the flat portions BFL-F according to an exemplary embodiment.

A first insulation layer IL1 covering the first conductive patterns may be disposed on the first conductive patterns. The first insulation layer IL1 entirely overlaps the first conductive patterns and protects the first conductive patterns from contacting external moisture and foreign substances.

The first insulation layer IL1 according to an exemplary embodiment may include first insulative flat portions IL1-F entirely overlapping the buffer layer BFL and overlapping the flat portions BFL-F and first insulative recessed portions IL1-R1 overlapping the recessed portions BFL-R1. In more detail, each of the first insulative flat portions IL1-F may have a flat top surface and cover the first conductive patterns. Also, the first insulative recessed portions IL1-R1 may overlap the corresponding emission area of the emission area PXA, and a first insulation groove may be defined in each of the first insulative recessed portions IL1-R1. For example, the first insulation grooves may be arranged in a one-to-one correspondence with the grooves defined in the recessed portions of the buffer layer BFL, as illustrated in FIG. 7B.

The second conductive patterns (refer to FIG. 8B that will be described later) may be disposed on the first insulation layer Ill, and the second insulation layer IL2 covering the second conductive patterns may be disposed on the second conductive patterns. A second insulation layer IL2 may entirely overlap the buffer layer BFL and the first insulation layer IL1. The second insulation layer IL2 may include second insulative flat portions IL2-F overlapping the first insulative flat portions IL1-F and second insulation recesses portions IL2-R1 overlapping the first insulative recessed portions IL1-R1. Second insulation grooves may be arranged in a one-to-one correspondence with the first insulation grooves respectively defined in the first insulative recessed portions IL1-R1 and may be respectively defined in the second insulative recessed portions IL2-R1.

Figure 8A:
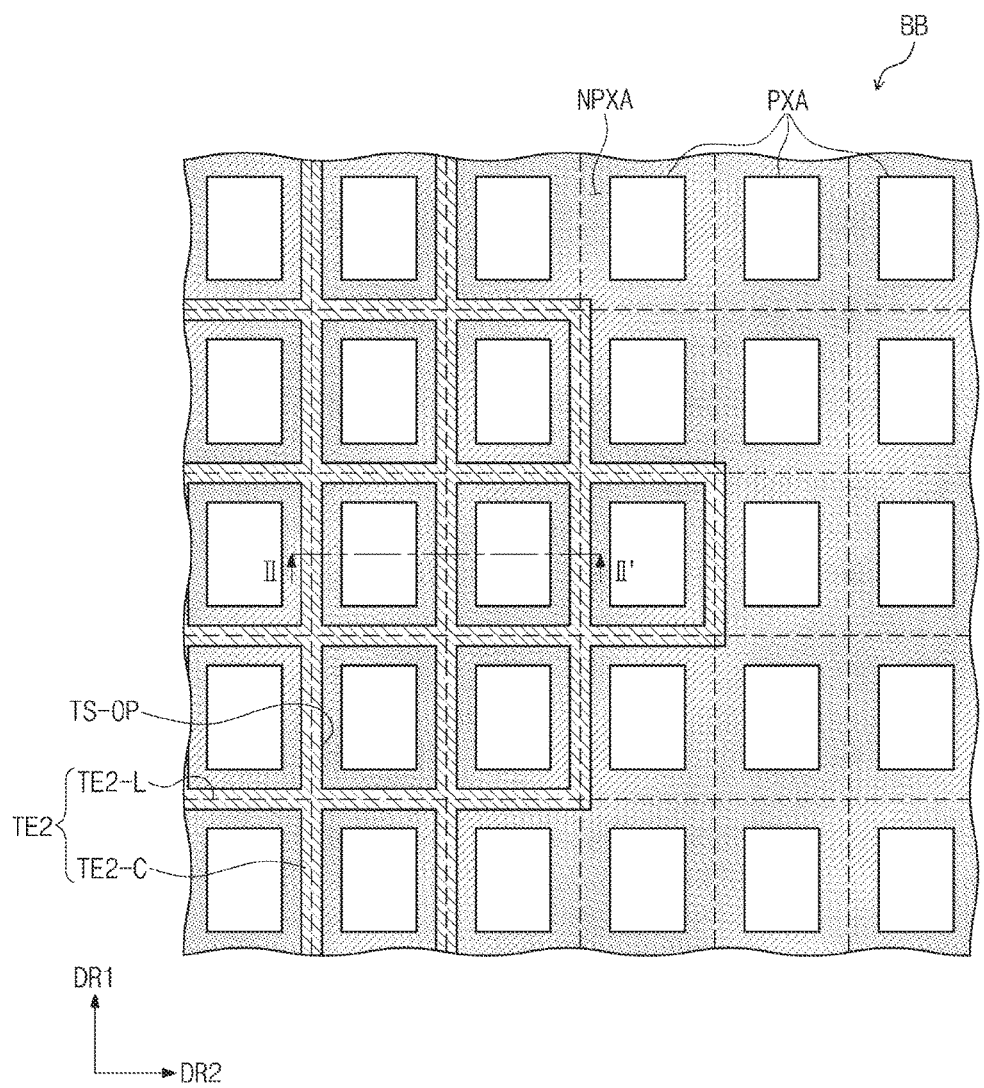
FIG. 8A is a partial enlarged view illustrating portion BB of FIG. 6B.
Figure 8B:
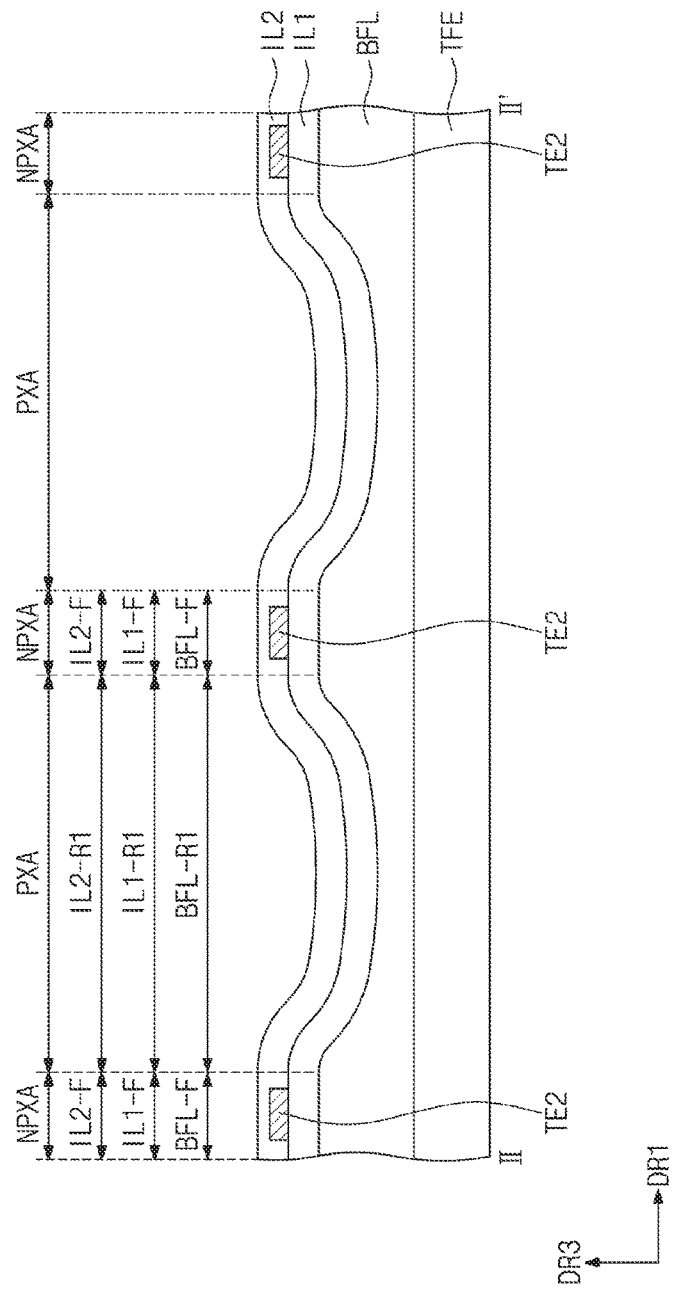
FIG. 8B is a partial cross-sectional view illustrating the display device taken along line II-II' of FIG. 8A.

FIG. 8A is a partial enlarged view of area BB in FIG. 6B, and FIG. 8B is a partial cross-sectional view of the display device taken along line II-II' in FIG. 8A. Detailed description regarding components previously described in the drawings will be omitted.

As illustrated in FIG. 8A, the second touch electrodes TE2 overlap non-emission area NPXA disposed adjacent to the emission area PXA. The second touch electrodes TE2 includes a plurality of second vertical portions TE2-C extending in the first directional axis DR1 and a plurality of second horizontal portions TE2-L extending in the second directional axis DR2. The plurality of second vertical portions TE2-C and the plurality of second horizontal portions TE2-L may be defined as a mesh line. The mesh line may have a line width of several μm.

The plurality of second vertical portions TE2-C and the plurality of second horizontal portions TE2-L are connected to each other to provide a plurality of touch openings TS-OP. In other words, each of the second touch electrodes TE2 has a mesh shape including the plurality of touch openings TS-OP. Although the touch openings TS-OP are arranged in a one-to-one correspondence with the emission areas PXA, the inventive concept is not limited thereto. For example, one touch opening TS-OP may correspond to two or more emission areas PXA.

Referring to FIG. 8B, the first conductive patterns (refer to FIG. 7B) may be disposed on the flat portions BFL-F of the buffer layer BFL according to an exemplary embodiment. The first insulation layer IL1 covering the first conductive patterns may be disposed on the first conductive patterns, and the first insulative flat portions IL1-F of the first insulation layer IL1 may provide a flat top surface to the second conductive patterns. In FIG. 8B, the second touch electrodes TE2 are illustrated as an example of the second conductive patterns.

The second insulation layer IL2 covering the second conductive patterns may be disposed on the second conductive patterns.

Figure 9A:
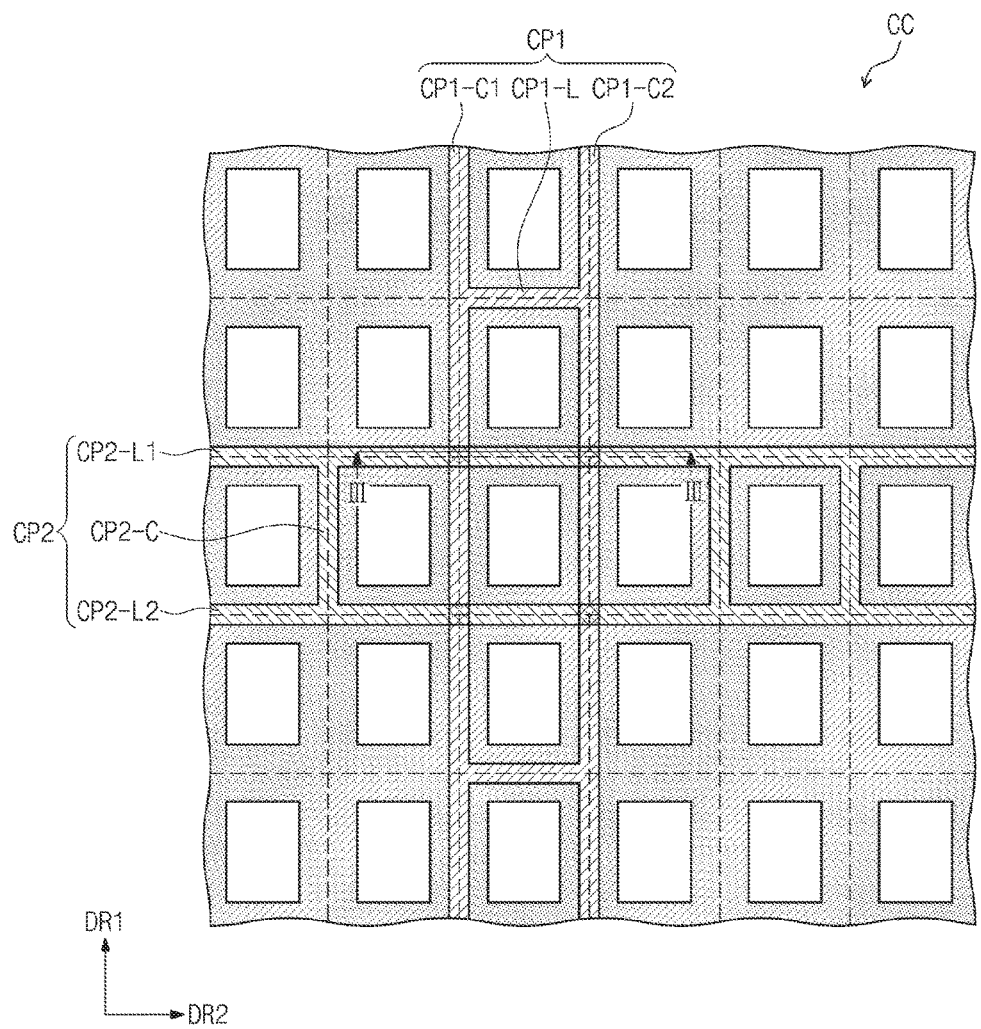
FIG. 9A is a partial enlarged view illustrating portion CC of FIGS. 6A and 6B.

FIG. 9A is a partial enlarged view of area CC in FIGS. 6A and 6B, and FIG. 9B is a cross-sectional view of the area CC take along line III-III'.

The area CC corresponds to a partial area in which the first conductive patterns CDP1 (refer to FIG. 6A) and the second conductive patterns CDP2 (refer to FIG. 6B) are overlapped with each other. As illustrated in FIGS. 9A and 9B, a first connecting part CP1 may include third horizontal portions CP1-L connecting third vertical portions CP1-C1 and CP1-C2 to third vertical portions CP1-C1 and CP1-C2, which are disposed on the buffer layer BFL. Although two third vertical portions CP1-C1 and CP1-C2 are illustrated in FIGS. 9A and 9B, the inventive concept is not limited thereto.

A second connecting part CP2 may include fourth vertical portions connecting fourth horizontal portions CP2-L1 and CP2-L2 to fourth horizontal portions CP2-L1 and CP2-L2, which are disposed on the first insulation layer IL2. The first connecting part CP1 may have a mesh shape, and the second connecting part CP2 may also have a mesh shape.

As illustrated in FIG. 9B, two third vertical portions CP1-C1 and CP1-C2 may be disposed on the flat portion BFL-F of the buffer layer BFL. A first insulative flat portion IL1-F of the first insulation layer IL1 covering the two third vertical portions CP1-C1 and CP1-C2 may overlap the flat portion BFL-F of the buffer layer BFL. Also, the first insulative flat portion IL1-F may provide a flat top surface to a fourth horizontal portion CP2-L1, and a second insulative flat portion IL2-F covering the fourth horizontal portion CP2-L1 may overlap the first insulative flat portion IL1-F.

As described above, because each of the first touch electrodes TE1-1 to TE1-3 and the second touch electrodes TE2-1 to TE2-3 has a mesh shape, the flexible display device DD has improved flexibility. When the flexible display device DD is bent, as illustrated in FIGS. 1B and 2B, tensile stress/compressive stress applied to the first touch electrodes TE1-1 to TE1-3 and the second touch electrodes TE2-1 to TE2-3 may be reduced to prevent the first touch electrodes TE1-1 to TE1-3 and the second touch electrodes TE2-1 to TE2-3 from fracturing.

Also, since the display panel DP and the touch sensing part TS of the flexible display device DD according to an exemplary embodiment include the recessed portions defined by the groove, when bent with respect to a bending axis BX, the tensile stress and the compressive stress of the bending may be further reduced as compared to those of the display device having only flat surfaces, and thus, the bending operation may be further easily performed.

Figure 10A:
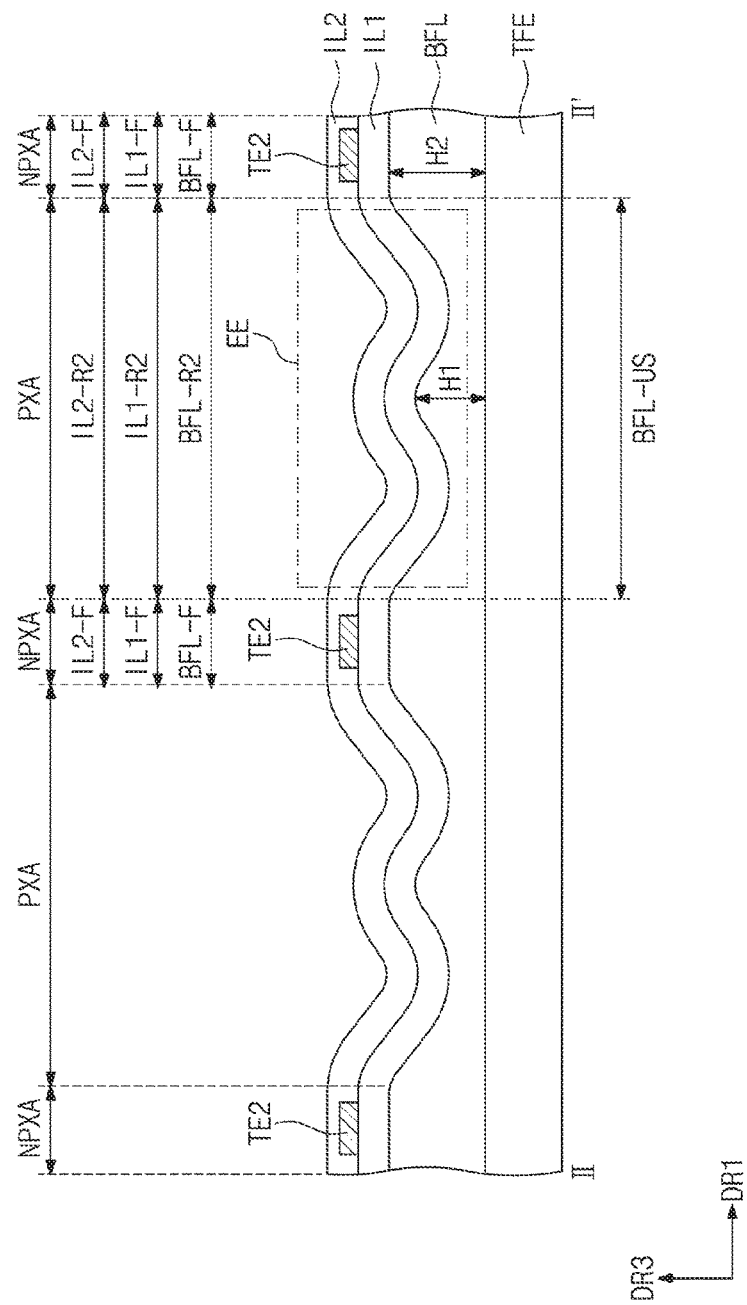
FIG. 10A is a cross-sectional view illustrating a first shape of a recessed portion according to an exemplary embodiment.
Figure 10B:
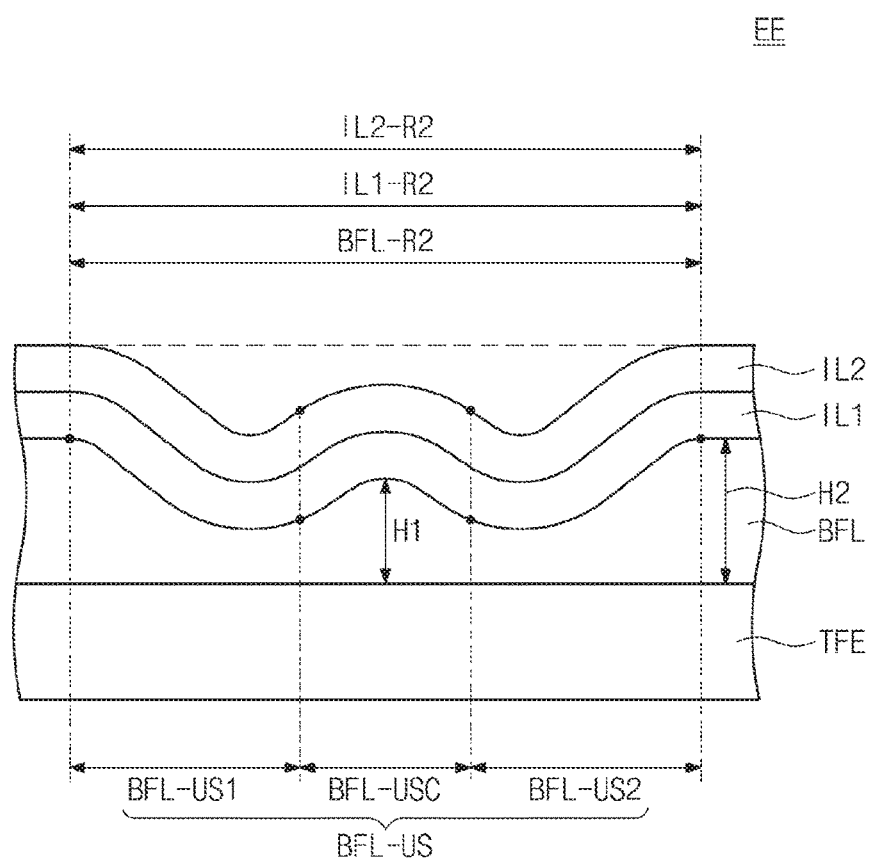
FIG. 10B is a partial enlarged view of portion EE of FIG. 10A.
Figure 10C:
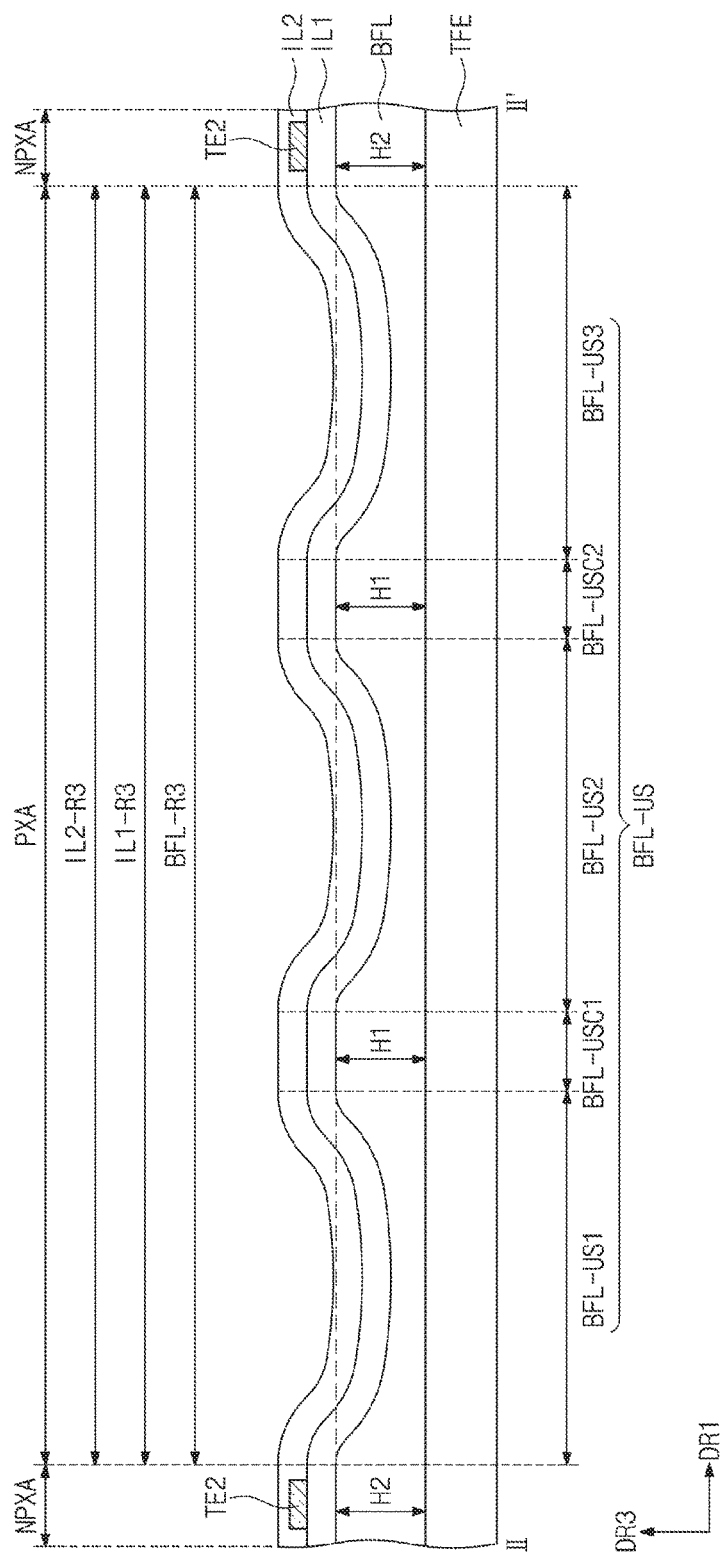
FIG. 10C is a cross-sectional view illustrating a second shape of the recessed portion according to an exemplary embodiment.

FIG. 10A is a cross-sectional view illustrating a first shape of a recessed portion according to an exemplary embodiment; FIG. 10B is a partial enlarged view illustrating area EE in FIG. 10A; and FIG. 10C is a cross-sectional view illustrating a second shape of the recessed portion according to an exemplary embodiment. FIGS. 10A and 10B illustrate a cross-section taken along line II-II' in FIG. 6B. Detailed description regarding the same components described above will be omitted.

The recessed portion of the buffer layer BFL may include a top surface BFL-US defined by the groove. The top surface BFL-US may include recessed connecting portions connecting at least two sub-recessed portions to two sub-recessed portions disposed adjacent thereto. Here, the recessed connecting portions may provide a flat top surface to the first insulation layer IL1. On the contrary, the recessed portions may provide a top surface protruding in a normal direction (a direction corresponding to a third directional axis DR3) of the buffer layer BFL to the first insulation IL1. The recessed connecting portion may have a maximum height H1 equal to or less than a height H2 of the flat portion BFL-F.

For example, as illustrated in FIGS. 10A and 10B, the top surface BFL-US may include a recessed connecting portion BFL-USC connecting a first sub-recessed portion BFL-US1 and a second sub-recessed portion BFL-US2 to a first sub sub-recessed portion BFL-US1 and a second sub-recessed portion BFL-US2. In this case, the recessed connecting portion BFL-USC may be divided with respect to an inflection point at which the bending of the top surface BFL-US is changed. In other words, the recessed connecting portion BFL-USC may be divided into the first sub-recessed portion BFL-US1 and the second sub-recessed portion BFL-US2 with reference to a position at which the recessed portion is changed into the protruding portion in the third directional axis DR3 on the top surface BFL-US.

The recessed connecting portion BFL-USC according to an exemplary embodiment may provide the top surface protruding in the third directional axis DR3 to the first insulation layer IL1. In the first insulation layer IL1 and the second insulation layer IL2, the first insulative recessed portion IL1-R2 and the second insulative recessed portion IL2-R2 may be respectively defined in the recessed portion BFL-R2 by the first insulation groove and the second insulation groove, which is arranged in a one-to-one correspondence with the groove providing the top surface BFL-US of the recessed portion BFL-R2.

In the exemplary embodiment illustrated in FIGS. 10A and 10B, the first height H1 may be less than the second height H2. Although the top surface BFL-USC corresponding to the recessed connecting portion protrudes along the third directional axis DR3 in FIGS. 10A and 10B, the top surface BFL-USC corresponding to the recessed connecting portion may instead be flat.

For example, referring to FIG. 10C, the top surface BFL-US may include two recessed connecting portions BFL-USC1 and BFL-USC2 connecting three sub-recessed portions BFL-US1, BFL-US2, and BFL-US3 to third sub-recessed portions BFL-US1, BFL-US2, and BFL-US3. In FIG. 10C, the two recessed connecting portions BFL-USC1 and BFL-USC2 may provide a flat top surface to the first insulation layer IL1. Also, each of the two recessed connecting portions BFL-USC1 and BFL-USC2 may have a maximum height H1 equal to a height H2 of the flat portion BFL-F.

Figure 11A:
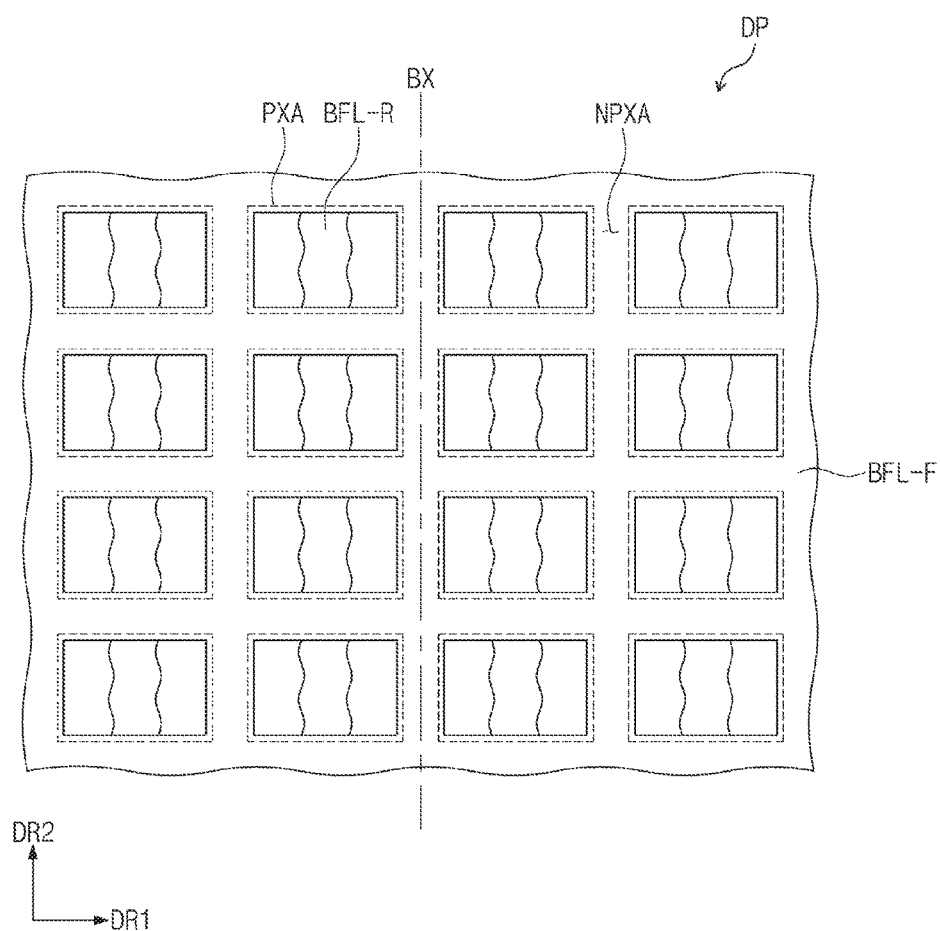
FIG. 11A and FIG. 11B are plan views illustrating the display panel according to an exemplary embodiment.
Figure 11B:
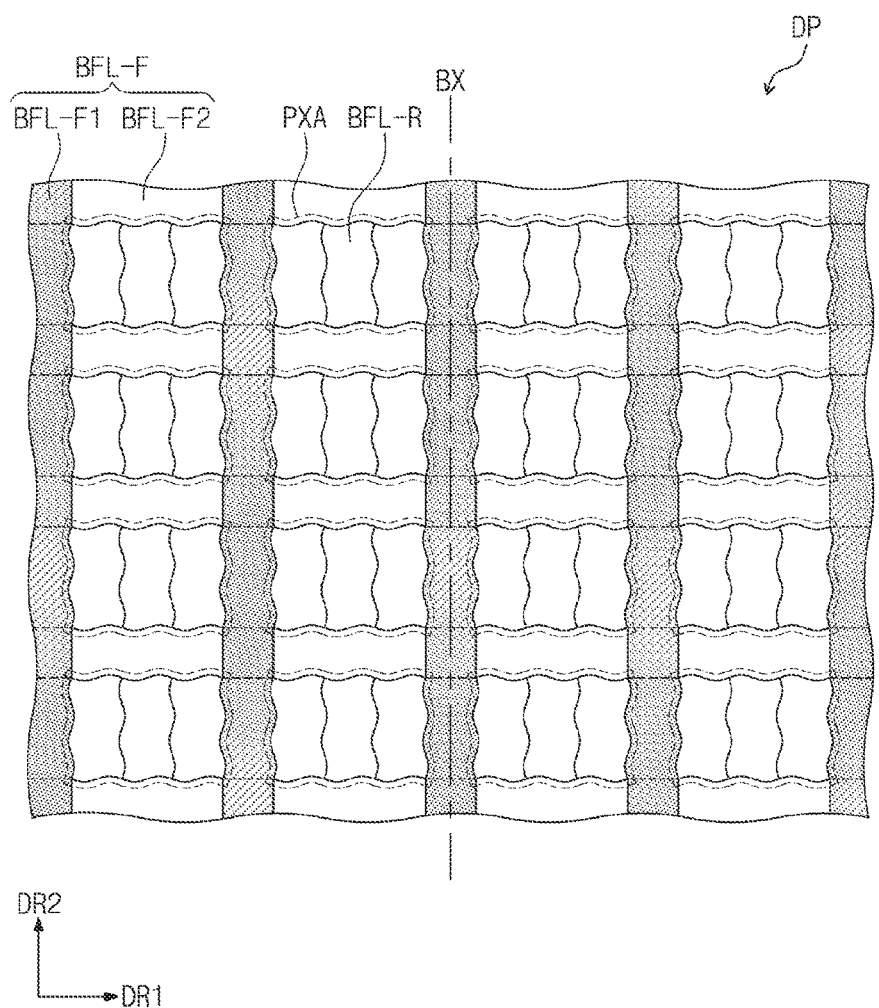

FIGS. 11A and 11B are plan views of the display panel DP according to an exemplary embodiment.

The display panel DP may include the emission areas PXA and non-emission area NPXA surrounding the emission areas PXA. In FIGS. 11A and 11B, the buffer layer BFL disposed on the upper portion of the display panel DP is illustrated as a plane defined by the first directional axis DR1 and the second directional axis DR2.

The recessed portions BFL-R may overlap the corresponding emission area of the emission areas PXA. In FIGS. 11A and 11B, the corresponding emission area of the emission areas PXA is expressed by a dot line. Although a size of each of the recessed portions BFL-R corresponds to that of the corresponding emission area PXA of the emission areas in FIGS. 11A and 11B, each of the recessed portions BFL-R may have a size smaller than that of the corresponding emission area of the emission areas PXA. Also, each of the recessed portions BFL-R in this exemplary embodiment may have one of the shapes of the recessed portions BFL-R1 illustrated in FIG. 4C, the recessed portions BFL-R2 illustrated in FIGS. 7B, 8B, 10A, and 10B, and the recessed portions BFL-R3 illustrated in FIG. 10C, as described above.

The recessed portions BFL-R are arranged in the first directional axis DR1 and extend in the second directional axis DR2 on the display panel DP. Each of the recessed portions BFL-R may be bent several times on the plane defined by the first directional axis DR1 and the second directional axis DR2. For example, each of the recessed portions BFL-R may be bent several times in a direction perpendicular to an axis parallel to the bending axis BX of the display panel.

As a more specific example, as shown in FIGS. 11A and 11B, when the bending axis BX is parallel to the second directional axis DR2, each of the recessed portions BFL-R may provide a wave pattern bent in the first directional axis DR1. The wave pattern may be a pattern in which portions protruding toward each of directions opposite to each other (e.g., left direction and right direction) of the first directional axis DR1 with respect to one axis parallel to the second directional axis DR2 are repeated without overlapping with each other to extend in the second directional axis DR2.

As shown in FIG. 11B, the flat portions BFL-F may be bent several times on the plane defined by the first directional axis DR1 and the second directional axis DR2. Referring to FIG. 11B, partial flat portions BFL-F1 of the flat portions BFL-F, which are arranged in the first directional axis DR1 and extend in the second directional axis DR2, may be bent several times on the plane defined by the first directional axis DR1 and the second directional axis DR2. Here, the partial flat portions BFL-F1 may be bent to correspond to the recessed portions BFL-R on the plane defined by the first directional axis DR1 and the second directional axis DR2.

Also, the rest of the flat portions BFL-F2 except for the partial flat portions BFL-F1 of the flat portions BFL-F may be bent several times in a direction perpendicular to a direction in which the partial flat portions BFL-F1 is bent on the plane defined by the first directional axis DR1 and the second directional axis DR2. For example, when the partial flat portions BFL-F1 provide the wave pattern bent in the first directional axis DR1, the remaining flat portions BFL-F2 may provide a wave pattern bent in the second directional axis DR2.

Figure 12:
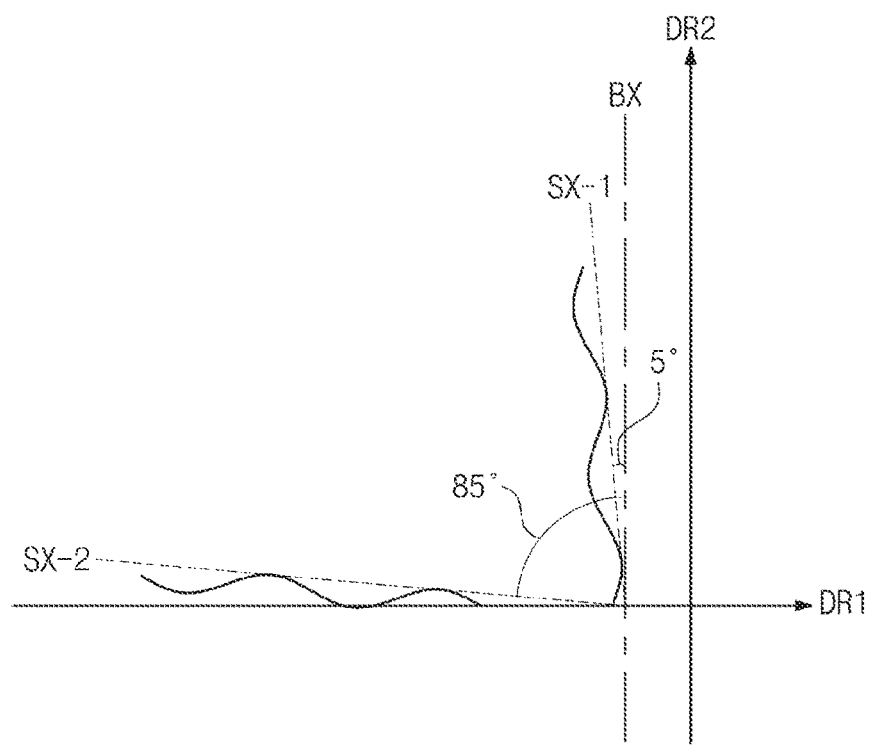
FIG. 12 is a conceptual view for explaining relationship between a bending axis and a plurality of uneven patterns defined on a plane according to an exemplary embodiment.

FIG. 12 is a conceptual view for explaining a relationship of a plurality of bending patterns defined on the bending axis BX and the plane according to an exemplary embodiment.

The display panel DP according to an exemplary embodiment may be bent with reference to the bending axis BX. For example, the bending axis BX may be parallel to the second directional axis DR2.

The above-described recessed portions of the buffer layer BFL may provide a plurality of patterns protruding in both directions (e.g., left and right directions) on the plane defined by the first directional axis DR1 and the second directional axis DR2. In the plurality of protruding patterns, a reference axis SX may be defined by an average of a tangential line tangent to at least two positions protruding in one direction of the both directions and a tangential line tangent to two positions protruding in the other direction. Here, the reference axis SX may be provided between an axis SX-1 inclined at an angle of about 5° from the bending axis and an axis SX-2 inclined at an angle of about 85° from the bending axis.

FIGS. 13A to 13J are cross-sectional view for explaining a method of manufacturing a flexible display device according to an exemplary embodiment. For a more exact description, the cross-sectional view taken along line I-I' in FIG. 7A and the cross-sectional view taken along line II-II' in FIG. 8A are connected to each other in FIGS. 13A to 13J.

Figure 13A:
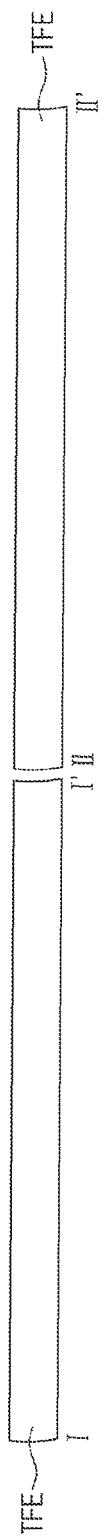
Figure 13B:
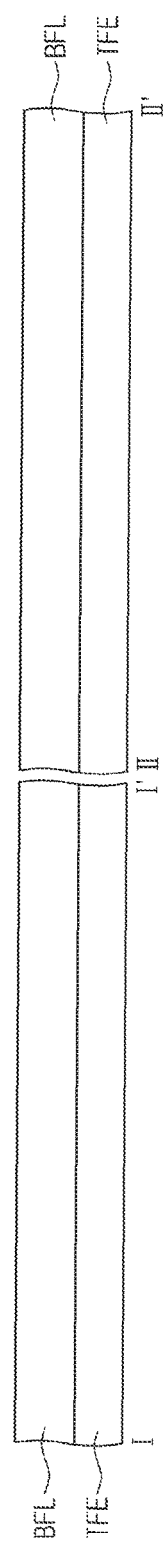
Figure 13C:
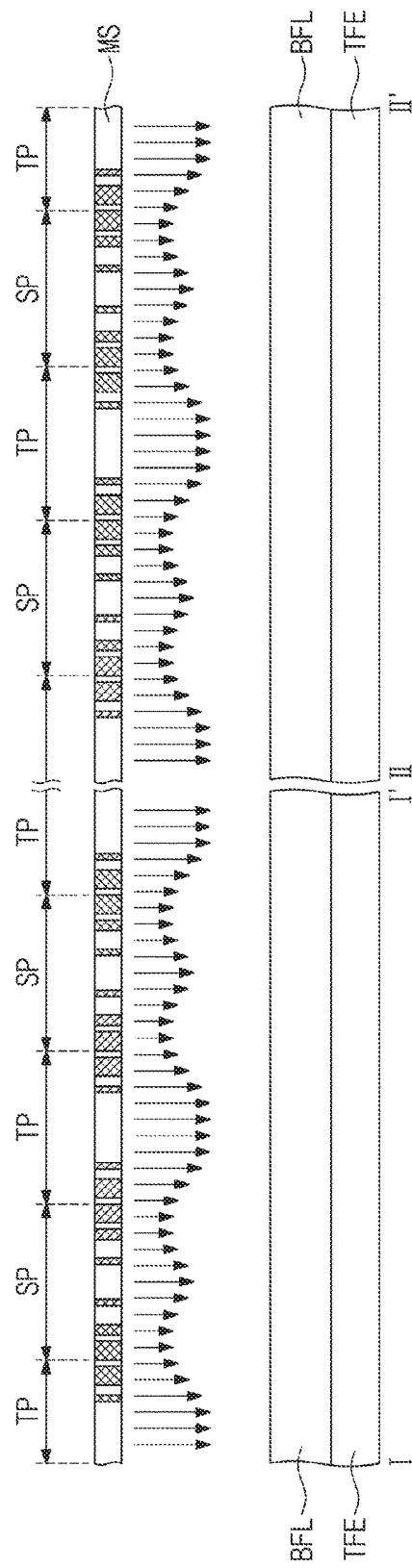
Figure 13D:
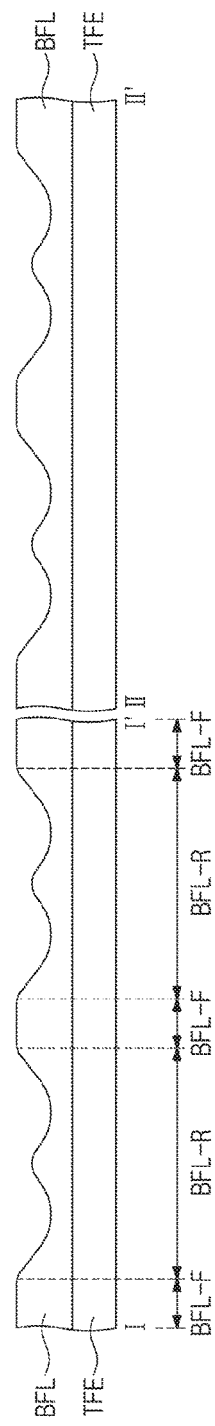
Figure 13E:
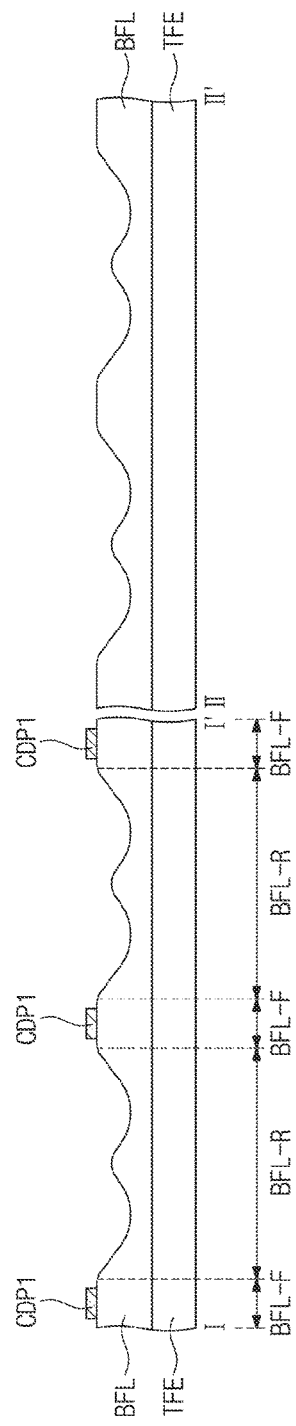

First, referring to FIG. 13A, the display panel of the flexible display device according to an exemplary embodiment includes an encapsulation layer TFE. Although not shown in the drawing, the encapsulation layer TFE may be disposed on the substrate, the circuit layer, and the element layer. A preliminary buffer layer BFL is formed on the encapsulation layer TFE, as illustrated in FIG. 13B. As illustrated in FIG. 13C, recessed portions including flat portions and grooves are formed by using a mask MS including a plurality of transmission portions TP and a plurality of slit portions SP. Here, the mask may be one of a half-tone mask and a slit mask. Hereinafter, the mask according to an exemplary embodiment will be described as the half-tone mask.

Figure 13F:
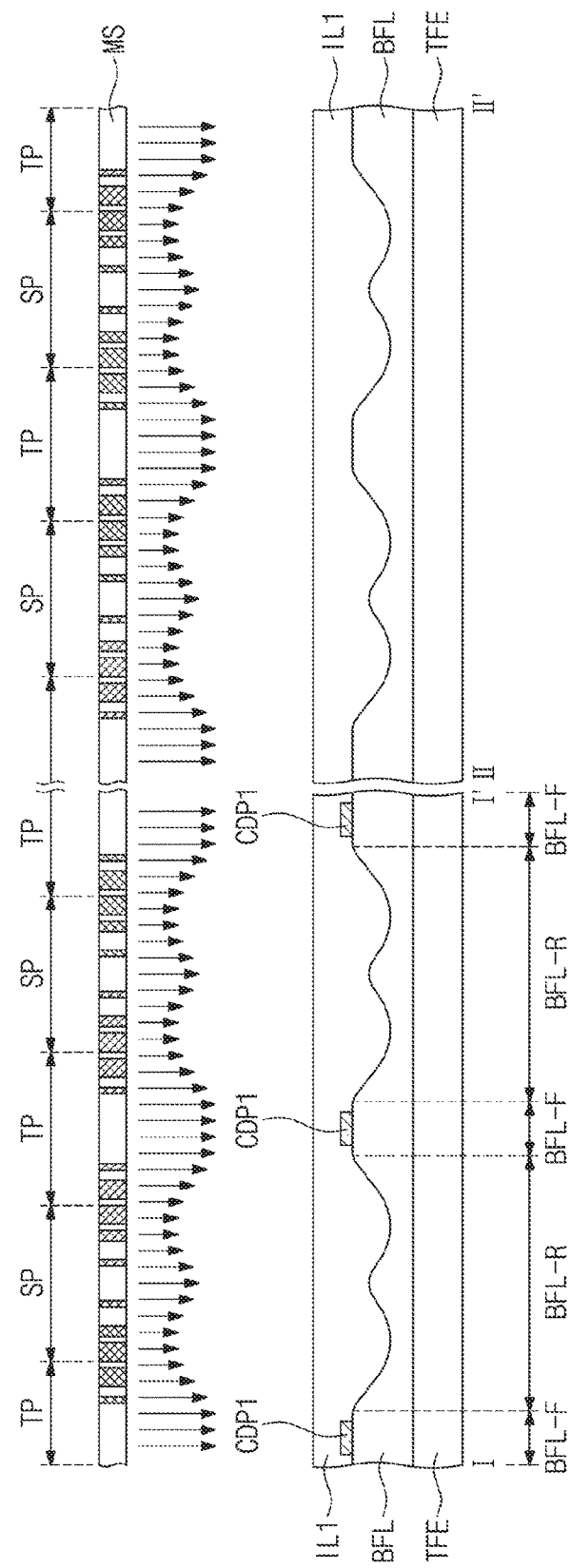

The plurality of transmission portions TP correspond to portions from which a metallic material blocking light incident into the mask is removed, and the plurality of slit portions SP correspond to portions in which a slit is formed in the metallic material to allow a portion of the incident light to be transmitted. As shown in FIG. 13C, when the light incident into the mask MS is irradiated to the buffer layer BFL, the recessed portions BFL-R each of which has the groove may be respectively formed on the areas corresponding to positions of the plurality of transmission portion TP of the buffer layer BFL. Also, areas corresponding to positions of the plurality of slit portions SP of the buffer layer BFL may be maintained to be flat. That is, the flat portions BFL-F are formed on the areas corresponding to the positions of the plurality of slit portions SP Referring to FIG. 13E, first conductive patterns CDP1 are respectively disposed on the flat portions BFL-F of the buffer layer BFL. Here, the first conductive patterns CDP1 may be formed on the flat portions by using a method such as photolithography, sputtering, and deposition. Thereafter, as illustrated in FIG. 13F, the first preliminary insulation layer IL1 covering the first conductive patterns CDP1 entirely overlaps the buffer layer BFL. As illustrated in FIG. 13G, first insulative recessed portions IL1-R and first insulative flat portions IL1-F respectively corresponding to the recessed portions BFL-R and the flat portions BFL-F may be formed in the first preliminary insulation layer IL1 by using the same mask MS.

Figure 13H:
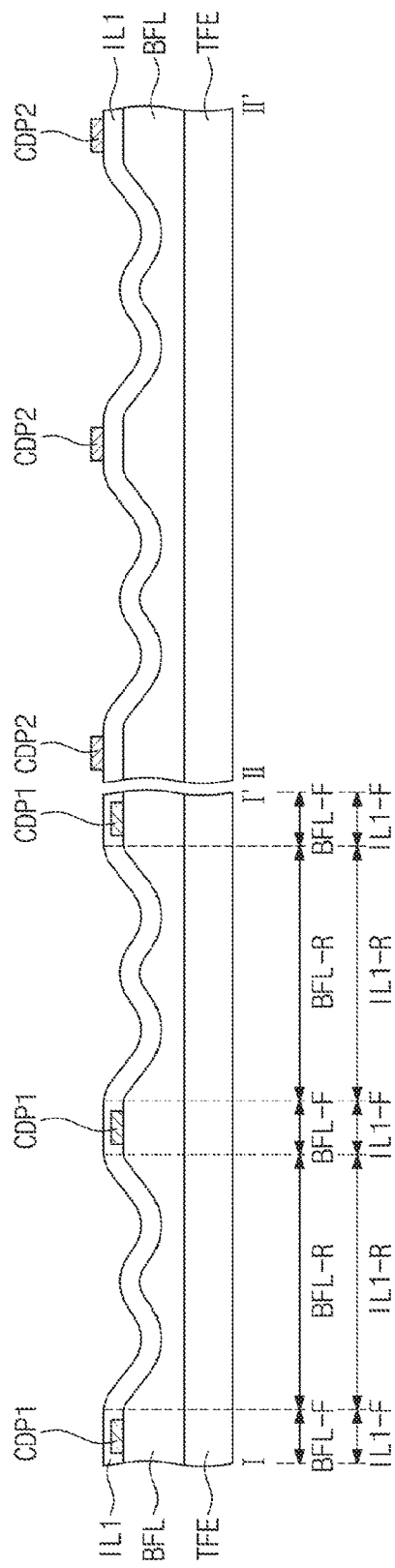
Figure 13I:
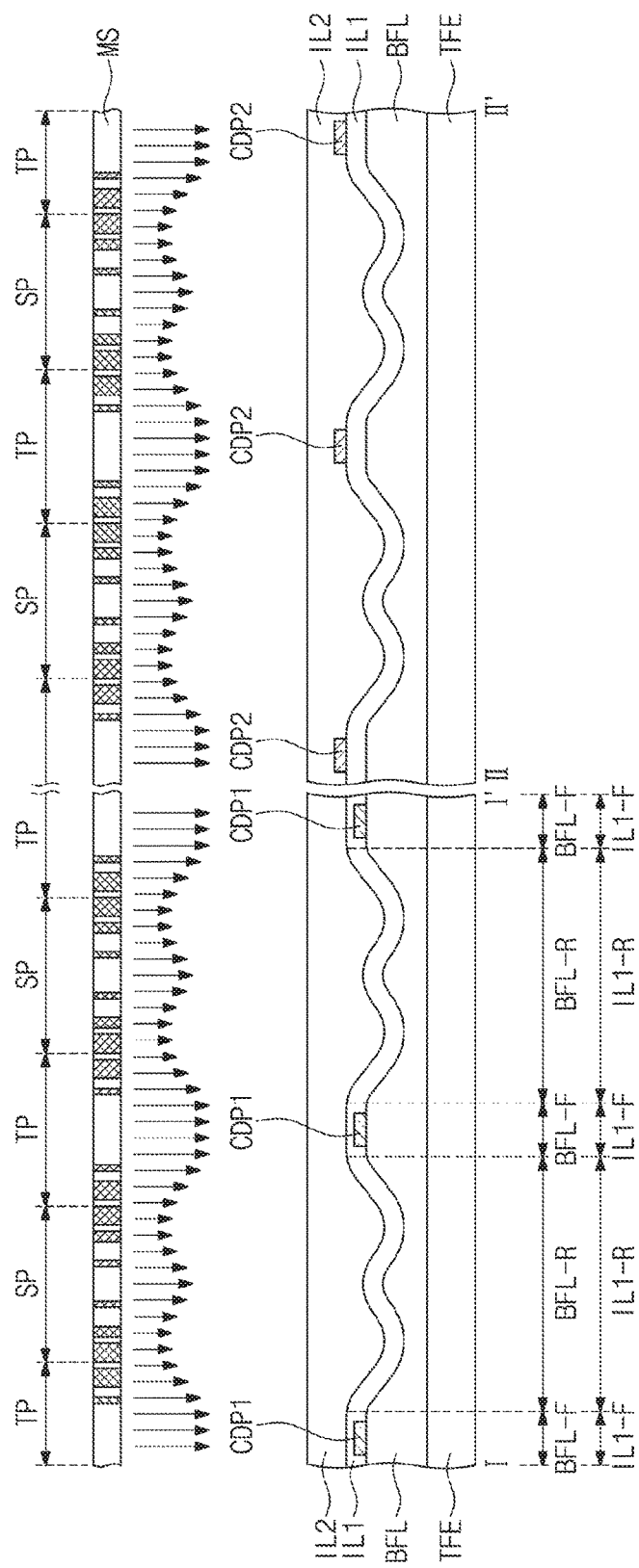
Figure 13J:
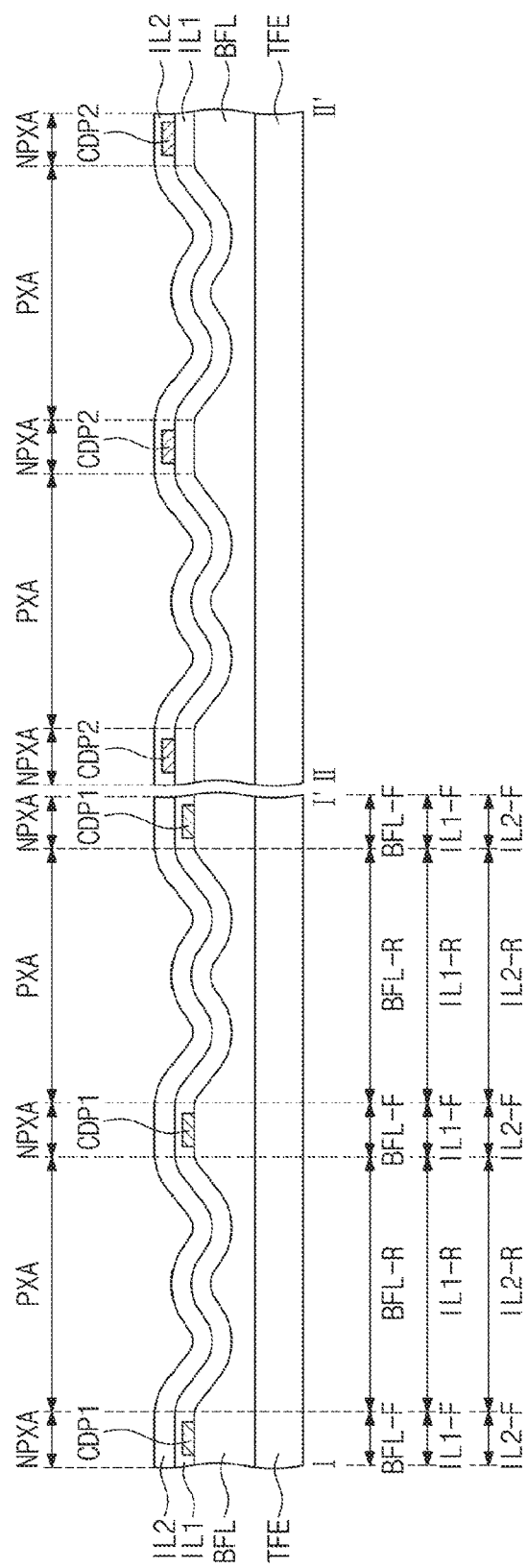

Thereafter, as illustrated in FIG. 13H, second conductive patterns CDP2 are disposed on the first insulative flat portions IL1-F. Similar to the first conductive patterns CDP1, the second conductive patterns CDP2 may be formed by using a method such as photolithography, sputtering, or a deposition. Also, when a second preliminary insulation layer IL2 covers the second conductive patterns CDP2, as illustrated in FIG. 13I, the second insulative recessed portions IL2-R corresponding to the first insulative recessed portions IL1-R and the second insulative flat portions IL2-F corresponding to the first insulative flat portions IL1-F may be formed by using the mask MS, as illustrated in FIG. 13J.

As described above, when the portion of the buffer layer providing the top surface to the touch sensing part is unevenly provided to bend the display device, the flexible display device that is further flexible may be provided by reducing the occurring tensile and compressive stresses.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A flexible display device comprising:
a display panel comprising:
a base substrate;
a circuit layer disposed on the base substrate;
an element layer disposed on the circuit layer;
an encapsulation layer configured to encapsulate the element layer; and
a buffer layer disposed on the encapsulation layer and divided into emission areas and a non-emission area disposed adjacent thereto; and
a touch sensing part comprising conductive patterns disposed on the buffer layer and an insulation layer covering the conductive patterns,
wherein the buffer layer comprises:
recessed portions, each of which having a groove overlapping a corresponding emission area of the emission areas; and
flat portions connected to the recessed portions.

2. The flexible display device of claim 1, wherein:
the flat portions overlap the non-emission area; and
the conductive patterns are disposed on the flat portions.

3. The flexible display device of claim 2, wherein:
the conductive patterns comprises first conductive patterns disposed on the buffer layer and second conductive patterns disposed on the first conductive patterns to overlap a portion of the first conductive patterns, and
the insulation layer comprises a first insulation layer covering the first conductive patterns and a second insulation layer disposed on the first insulation layer to cover second conductive patterns.

4. The flexible display device of claim 3, wherein:
the first conductive patterns extend in a first directional axis and are arranged in a second directional axis perpendicular to the first directional axis on the buffer layer; and
the second conductive patterns extend in the second directional axis and are arranged in the first directional axis on the first insulation layer.

5. The flexible display device of claim 4, wherein the respective conductive patterns of the first conductive patterns and the second conductive patterns have a mesh shape in which a plurality of touch openings are defined.

6. The flexible display device of claim 1, wherein:
the insulation layer entirely overlaps the buffer layer; and
the insulation layer comprises insulative flat portions overlapping the flat portions and insulative recessed portions overlapping the recessed portions.

7. The flexible display device of claim 6, wherein the insulative flat portions cover the conductive patterns, and each of the insulative flat portions has a flat top surface.

8. The flexible display device of claim 7, wherein each of the insulative recessed portions comprises an insulation groove overlapping a corresponding emission area of the emission areas.

9. The flexible display device of claim 8, wherein the grooves and the insulation grooves are arranged in a one-to-one correspondence with each other.

10. The flexible display device of claim 1, wherein:
each of the recessed portions comprises a top surface defined by the grooves; and
the top surface comprises a first sub-recessed portion, a second sub-recessed portion, and a recessed connecting portion configured to connect the first sub-recessed portion to the second sub-recessed portion.

11. The flexible display device of claim 10, wherein the recessed connecting portion has a maximum height equal to or less than a height of the flat portion.

12. The flexible display device of claim 1, wherein:
the recessed portions are arranged in a first directional axis and extend in a second directional axis perpendicular to the first directional axis; and
the recessed portions are bent several times on a plane defined by the first directional axis and the second directional axis.

13. The flexible display device of claim 12, wherein the flexible display device is bent along a bending axis parallel to the second directional axis.

14. The flexible display device of claim 13, wherein:
the recessed portions provide a plurality of patterns respectively protruding in opposite directions; and
a reference axis defined by an average of a tangential line tangent to at least two positions protruding in a first one of the opposite directions and a tangential line tangent to at least two positions protruding in a second one of the opposite directions in the plurality of patterns is inclined at an angle of about 5° to about 85° from the bending axis.

15. The flexible display device of claim 12, wherein the flat portions are arranged in the first directional axis, and partial flat portions extending in the second directional axis are bent several times on a plane defined by the first directional axis and the second directional axis.

16. The flexible display device of claim 15, wherein the partial flat portions are bent to correspond to the recessed portions on the plane.

17. The flexible display device of claim 15, wherein the rest of the flat portions except for portions of the flat portions are bent several times in the second directional axis on the plane.

18. A method of manufacturing a flexible display device, the method comprising:
providing a display panel comprising a substrate, a circuit layer, an element layer, and an encapsulation layer, the display panel being divided into emission areas and a non-emission area;
forming a buffer layer comprising recessed portions each of which has a groove overlapping a corresponding emission area of the emission areas and flat portions connecting the recessed portions to each other on the encapsulation layer; and
forming a touch sensing part comprising conductive patterns and an insulation layer covering the conductive patterns on the buffer layer.

19. The method of claim 18, wherein the forming of the buffer layer comprises:
forming a preliminary buffer layer on the encapsulation layer; and
forming the groove overlapping the corresponding emission area by using a mask comprising a plurality of transmission portions and a plurality of slit portions.

20. The method of claim 19, wherein the forming of the touch sensing part comprises:
forming conductive patterns on the flat portions;
forming a preliminary insulation layer; and forming insulation grooves arranged in a one-to-one correspondence with the grooves on the preliminary insulation layer by using the mask.

* * * * *